(12) United States Patent
Huang et al.

(10) Patent No.: US 10,115,781 B2
(45) Date of Patent: Oct. 30, 2018

(54) ORGANIC LIGHT-EMITTING DIODE DISPLAY

(71) Applicant: Chunghwa Picture Tubes, LTD., Taoyuan (TW)

(72) Inventors: Szu-Chi Huang, Changhua County (TW); Chin-Hai Huang, Taoyuan County (TW); Bo-Jhang Sun, Kaohsiung (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 156 days.

(21) Appl. No.: 15/047,649

(22) Filed: Feb. 19, 2016

(65) Prior Publication Data

US 2016/0172431 A1    Jun. 16, 2016

Related U.S. Application Data

(62) Division of application No. 14/133,653, filed on Dec. 19, 2013, now abandoned.

(30) Foreign Application Priority Data

Nov. 7, 2013   (TW) .............................. 102140462 A

(51) Int. Cl.
*H01L 27/32*      (2006.01)
*H01L 27/12*      (2006.01)
(Continued)

(52) U.S. Cl.
CPC ....... *H01L 27/3279* (2013.01); *G09G 3/3258* (2013.01); *H01L 27/124* (2013.01);
(Continued)

(58) Field of Classification Search
CPC ............. H01L 27/3244; H01L 27/3262; H01L 27/3279; H01L 27/3276; H01L 27/124; H01L 27/326

See application file for complete search history.

(56) References Cited

U.S. PATENT DOCUMENTS 7,675,061 B2 *   3/2010   Joo ...................... G09G 3/3233
                                                        257/59
7,710,022 B2 *   5/2010   Cok .................... G09G 3/3225
                                                       313/500

(Continued)

*Primary Examiner* — David Spalla
(74) *Attorney, Agent, or Firm* — JCIPRNET

(57) ABSTRACT

A pixel array substrate includes a first substrate, pixel units, data lines, scan lines, constant voltage lines, a constant voltage source, a constant voltage pad, and a conductive pattern. The first substrate has pixel regions and a peripheral region surrounding the pixel regions. The conductive pattern includes conductive lines interlaced with each other to form a net and a conductive frame that surrounds and is electrically coupled to the conductive lines. The conductive frame is in electrical contact with the constant voltage pad within the peripheral region. Each pixel region is defined by two adjacent scan lines and two adjacent data lines. A portion of one of the constant voltage lines located completely within each of the pixel regions is in electrical contact with one of the conductive lines within the pixel region. An OLED display including the pixel array substrate and another OLED are also provided.

8 Claims, 18 Drawing Sheets

(51) Int. Cl.
    *G09G 3/3258*    (2016.01)
    *H01L 29/786*    (2006.01)
(52) U.S. Cl.
    CPC ...... *H01L 27/1255* (2013.01); *H01L 27/3272* (2013.01); *H01L 29/78633* (2013.01); *G09G 2300/0421* (2013.01); *G09G 2300/0469* (2013.01); *G09G 2300/08* (2013.01); *G09G 2320/0233* (2013.01)

(56) References Cited

U.S. PATENT DOCUMENTS

| | | | |
|---|---|---|---|
| 8,446,348 B2 * | 5/2013 | Tanada | G09G 3/32 313/396 |
| 2011/0227816 A1 * | 9/2011 | Nakamura | G02F 1/133707 345/92 |
| 2013/0280905 A1 * | 10/2013 | Doman | H01L 27/0207 438/618 |

* cited by examiner

ORGANIC LIGHT-EMITTING DIODE DISPLAY

CROSS-REFERENCE TO RELATED APPLICATION

This application is a divisional application of U.S. application Ser. No. 14/133,653, filed on Dec. 19, 2013, now pending, which claims the priority benefits of Taiwan application serial no. 102140462, filed on Nov. 7, 2013. The entirety of each of the above-mentioned patent applications is hereby incorporated by reference herein and made a part of this specification.

BACKGROUND OF THE INVENTION

Field of the Invention

The invention relates to a pixel array substrate and a display, and more particularly to a pixel array substrate applicable to an organic light-emitting diode (OLED) display and an OLED display.

Description of Related Art

At present, displays are categorized into plasma displays, liquid crystal displays (LCD), inorganic electroluminescent displays, organic light-emitting diode (OLED) displays, field emission displays (FED), electro-chromic displays, and so forth. Compared with other types of displays, the OLED display has potential to become the mainstream in the next generation, for it has the advantages of self-luminescence, no viewing angle dependence, low power consumption, wide range of working temperature, fast response speed, full-color display, etc.

A conventional OLED display includes a plurality of pixel units distributed onto a substrate. Each of the pixel units includes a switch transistor, a driver transistor electrically coupled to the switch transistor, and a pixel electrode electrically coupled to the driver transistor. A constant voltage line transmits a constant voltage to an input electrode of the driver transistor of each pixel unit, such that the driver transistor is allowed to work in an amplification region. When the driver transistor stably works in the amplification region, the driver transistor is able to provide constant current to an OLED layer, and thereby each pixel unit is able to display images with proper brightness.

However, the distances from the pixel units distributed onto the substrate to a constant voltage source are inconsistent, thus leading to the difference in resistances between the input electrodes of the driver transistors and the constant voltage source. In this case, the constant voltage respectively transmitted to the input electrodes of the driver transistors may vary, and thereby the OLED display is not able to display images with favorable display quality.

From another perspective, in the conventional OLED display, a common electrode layer and a control electrode of the driver transistor may together constitute a pixel storage capacitor. Due to the excessively long distance between the common electrode layer and the control electrode of the driver transistor, the pixel storage capacitance is low, which poses a negative impact on the display effects of the OLED display.

SUMMARY OF THE INVENTION

The invention is directed to an organic light-emitting diode (OLED) display and a pixel array substrate capable of lessening the difference in resistances between input electrodes of driver transistors and a constant voltage source and further guaranteeing the favorable display capacity.

The invention is further directed to another OLED display capable of increasing pixel storage capacitance and further achieving satisfactory display effects.

In an embodiment of the invention, a pixel array substrate that includes a first substrate, a plurality of pixel units, a plurality of data lines, a plurality of scan lines, a plurality of constant voltage lines, a constant voltage source, a constant voltage pad, and a conductive pattern is provided. The first substrate has a plurality of pixel regions arranged in an array and a peripheral region surrounding the pixel regions. The pixel units are located in the pixel regions. Each of the pixel units includes a switch transistor, a driver transistor, and a pixel electrode. The switch transistor has an input electrode, a control electrode, and an output electrode; the driver transistor has an input electrode, a control electrode, and an output electrode. The output electrode of the switch transistor is electrically coupled to the control electrode of the driver transistor. The pixel electrode is electrically coupled to the output electrode of the driver transistor. The data lines are located on the first substrate and electrically coupled to the input electrodes of the switch transistors. The scan lines are located on the first substrate, interlaced with the data lines, and electrically coupled to the control electrodes of the switch transistors. The constant voltage lines are located on the first substrate and electrically coupled to the input electrodes of the driver transistors. The constant voltage source is located on the peripheral region of the first substrate and provides a constant voltage to the constant voltage lines. The constant voltage pad is located on the peripheral region of the first substrate and outputs the constant voltage. The conductive pattern is located on the first substrate. Here, the conductive pattern includes a plurality of conductive lines and a conductive frame. The conductive lines are interlaced with each other to form a net and located on the pixel regions of the first substrate. The conductive frame is located on the peripheral region of the first substrate. Here, the conductive frame surrounds and is electrically coupled to the conductive lines. The conductive frame is in electrical contact with the constant voltage pad within the peripheral region. Each of the pixel regions is defined by two adjacent scan lines and two adjacent data lines. Besides, each of the pixel regions covers at least one of the pixel units and a portion of one of the constant voltage lines. The covered portion of the one of the constant voltage lines completely within each of the pixel regions is located in the each of the pixel regions and is in electrical contact with one of the conductive lines of the conductive pattern.

In an embodiment of the invention, an OLED display that includes the aforesaid pixel array substrate, a second substrate opposite to the first substrate, an OLED layer located between the pixel electrodes and the second substrate, and a common electrode layer located between the second substrate and the OLED layer is provided.

In an embodiment of the invention, an OLED display that includes a pixel array substrate, a second substrate opposite to a first substrate, an OLED layer located between pixel electrodes and the second substrate, and a common electrode layer located between the second substrate and the OLED layer is provided. The pixel array substrate includes a first substrate, a plurality of pixel units, a plurality of data lines, a plurality of scan lines, a plurality of constant voltage lines, a constant voltage source, and a conductive pattern. The first substrate has a plurality of pixel regions arranged in an array and a peripheral region surrounding the pixel regions. The pixel units are located in the pixel regions. Each of the pixel units includes a switch transistor, a driver transistor, and a pixel electrode. The switch transistor has an input electrode, a control electrode, and an output electrode; the driver transistor has an input electrode, a control electrode, and an output electrode. The output electrode of the switch transistor is electrically coupled to the control electrode of the driver transistor. The pixel electrode is electrically coupled to the output electrode of the driver transistor. The data lines are located on the first substrate and electrically coupled to the input electrodes of the switch transistors. The scan lines are located on the first substrate and electrically coupled to the control electrodes of the switch transistors. The constant voltage lines are located on the first substrate and electrically coupled to the input electrodes of the driver transistors. The constant voltage source is located on the peripheral region of the first substrate and provides a constant voltage to the constant voltage lines. The conductive pattern is located on the first substrate and overlapped with the control electrode of each of the driver transistors. The common electrode layer is overlapped with the control electrodes of the driver transistors. A film layer where the control electrodes of the driver transistors are located are between the first substrate and a film layer where the input electrodes of the driver transistors are located. The film layer where the input electrodes of the driver transistors are located are between a film layer where the conductive pattern is located and the film layer where the control electrodes of the driver transistors are located. The film layer where the conductive pattern is located is between the OLED layer and the film layer where the input electrodes of the driver transistors are located. The conductive pattern is in electrical contact with the common electrode layer.

According to an embodiment of the invention, the conductive lines of the conductive pattern and the constant voltage lines are overlapped.

According to an embodiment of the invention, the conductive lines are divided into a plurality of first conductive lines and a plurality of second conductive lines, the first conductive lines are parallel to extension directions of the constant voltage lines, the second conductive lines are interlaced with the first conductive lines, and the constant voltage lines cover the first conductive lines.

According to an embodiment of the invention, the second conductive lines are overlapped with the control electrodes of the driver transistors and the data lines.

According to an embodiment of the invention, the constant voltage lines is overlapped with the control electrode of the driver transistor of the pixel units, so as to constitute a first storage capacitor. The conductive line is overlapped with the control electrode of the driver transistor of the pixel units, so as to constitute a second storage capacitor. The first storage capacitor and the second storage capacitor are connected in parallel to constitute a pixel storage capacitor of the pixel units.

According to an embodiment of the invention, the conductive pattern is in a film layer different from film layers where the output electrodes of the driver transistors, the input electrodes of the driver transistors, the control electrodes of the driver transistors, and the pixel electrodes are located.

According to an embodiment of the invention, a film layer where the control electrodes of the driver transistors are located are between the first substrate and a film layer where the input electrodes of the driver transistors are located. The film layer where the input electrodes of the driver transistors are located is between a film layer where the conductive pattern is located and the film layer where the control electrodes of the driver transistors are located.

According to an embodiment of the invention, a film layer where the conductive pattern is located is between the first substrate and a film layer where the input electrodes of the driver transistors are located. The film layer where the input electrodes of the driver transistors are located is between a film layer where the control electrodes of the driver transistors are located and the film layer where the conductive pattern is located.

According to an embodiment of the invention, the pixel array substrate further includes a plurality of light-shielding patterns. The light-shielding patterns respectively shield a plurality of channels of the switch transistors and a plurality of channels of the driver transistors.

According to an embodiment of the invention, the common electrode layer is overlapped with the control electrode of the driver transistor of the pixel unit to constitute a first storage capacitor. A portion of the conductive lines is overlapped with the control electrode of the driver transistor of the pixel unit to constitute a second storage capacitor. The first storage capacitor and the second storage capacitor are connected in parallel to constitute a pixel storage capacitor of the one of the pixel units.

According to an embodiment of the invention, the conductive pattern includes a plurality of conductive lines and a conductive frame. The conductive lines are interlaced with each other to form a net and located on the pixel regions of the first substrate. The conductive frame is located on the peripheral region of the first substrate. Here, the conductive frame surrounds and is electrically coupled to the conductive lines.

As discussed above, in the OLED display and the pixel array substrate of the OLED display described in an embodiment of the invention, the net-shaped conductive pattern lessens the difference in resistances between the constant voltage source and the input electrodes of the driver transistors distributed onto the first substrate, and thereby the constant voltage respectively transmitted into the input electrode of each driver transistor does not vary significantly. Thereby, the conventional issue of unfavorable display quality caused by the significant difference in resistances between the input electrodes of the driver transistors and the constant voltage source can be better resolved.

Besides, in the OLED display provided in another embodiment of the invention, through the conductive pattern that is in electrical contact with the common electrode and is overlapped with the control electrode of each pixel unit, the pixel storage capacitance of each pixel unit may increase, and thus the OLED display is able to accomplish favorable display effects.

To make the above features and advantages of the invention more comprehensible, several embodiments accompanied with drawings are described in detail as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

First Embodiment

Figure 1:
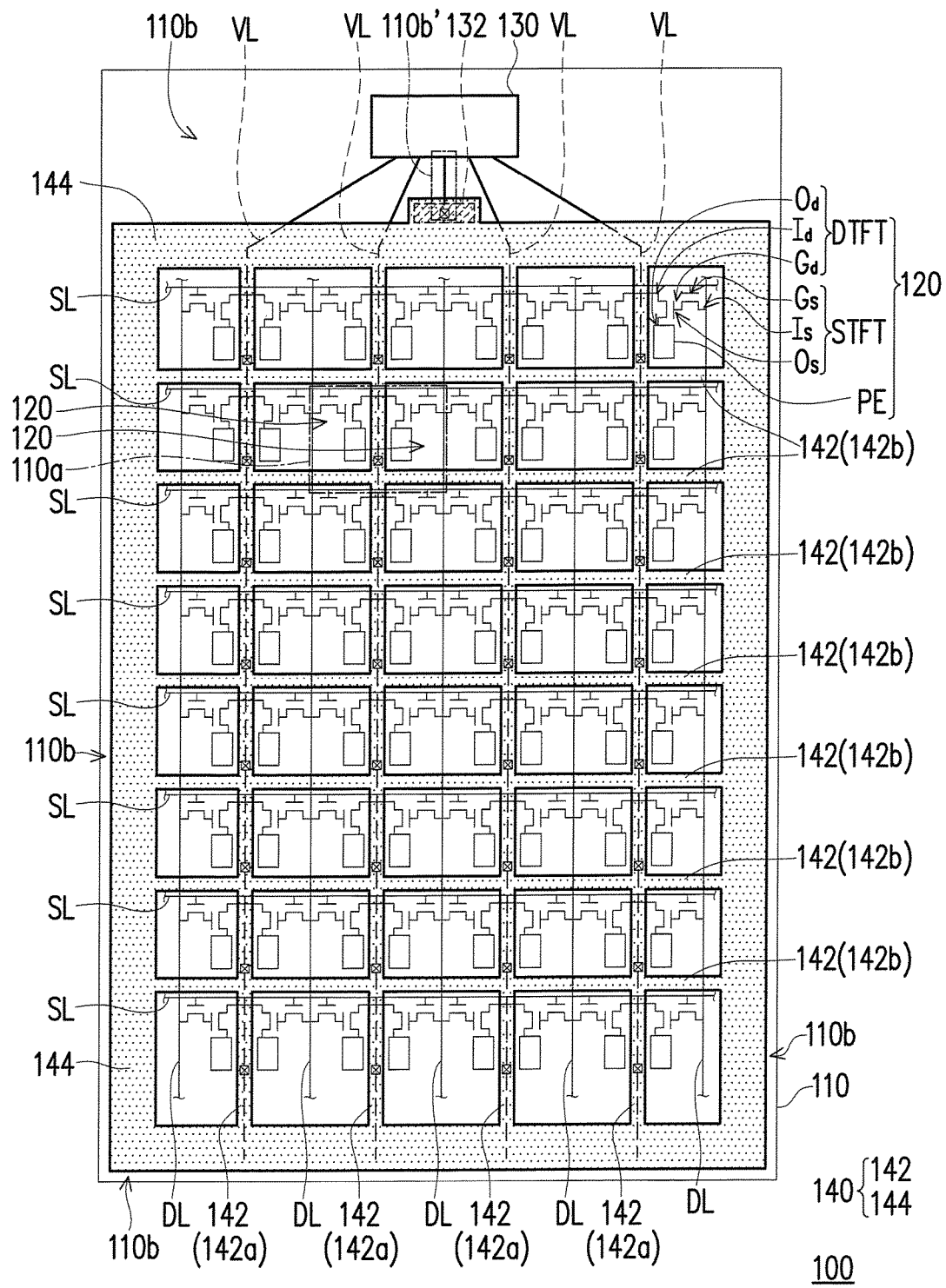
FIG. 1 is a schematic diagram illustrating a pixel array substrate according to a first embodiment of the invention.

FIG. 1 is a schematic diagram illustrating a pixel array substrate according to a first embodiment of the invention. With reference to FIG. 1, according to the present embodiment, the pixel array substrate 100 includes a first substrate 110, a plurality of pixel units 120, a plurality of data lines DL, a plurality of scan lines SL interlaced with the data lines DL, a plurality of constant voltage lines VL, a constant voltage source 130, and a constant voltage pad 132. The first substrate 110 has a plurality of pixel regions 110a arranged in an array and a peripheral region 110b surrounding the pixel regions 110a. Each of the pixel regions 110a is defined by two adjacent scan lines SL and two adjacent data lines DL. That is, each of the pixel regions 110a includes an area surrounded by two adjacent scan lines SL and two adjacent data lines DL, a portion of the two scan lines SL adjacent to the area, and a portion of the two data lines DL adjacent to the area. The pixel units 120 are located in the pixel regions 110a. To be specific, each of the pixel regions 110a includes at least one of the pixel units 120. In the present embodiment, each of the pixel regions 110a may include two of the pixel units 120. However, the invention is not limited thereto, and each of the pixel regions 110a may merely include one pixel unit 110a according to another embodiment.

Each of the pixel units 120 includes a switch transistor STFT, a driver transistor DTFT, and a pixel electrode PE. The switch transistor STFT has an input electrode Is, a control electrode Gs, and an output electrode Os; the driver transistor DTFT has an input electrode Id, a control electrode Gd, and an output electrode Od. In each of the pixel units 120, the output electrode Os of the switch transistor STFT is electrically coupled to the control electrode Gd of the driver transistor DTFT, and the pixel electrode PE is electrically coupled to the output electrode Od of the driver transistor DTFT. The data lines DL are located on the first substrate 110 and electrically coupled to the input electrodes Is of the switch transistors STFT. The scan lines SL are located on the first substrate 110 and electrically coupled to the control electrodes Gs of the switch transistors STFT. The constant voltage lines VL are electrically coupled to the input electrodes Id of the driver transistors DTFT. In the present embodiment, extension directions of the data lines DL may be perpendicular to extension directions of the scan lines SL, and extension directions of the constant voltage lines VL may be parallel to the extension directions of the data lines DL, for instance. However, the invention is not limited thereto, and the data lines DL, the scan lines SL, and the constant voltage lines VL may be arranged in another appropriate manner.

The constant voltage source 130 is located on the peripheral region 110b of the first substrate 110 and provides a constant voltage to the constant voltage lines VL. The constant voltage pad 132 is located on the peripheral region 110b of the first substrate 110 and outputs the constant voltage provided by the constant voltage source 130. In the present embodiment, the constant voltage pad 132 may be a conductive article separated from the constant voltage lines VL. However, the invention is not limited thereto, and the constant voltage pad 132 in another embodiment may refer to a portion of the constant voltage lines VL that is located in the peripheral region 110b and extended toward the constant voltage source 130.

The pixel array substrate 100 further includes a conductive pattern 140 located on the first substrate 110. The conductive pattern 140 includes a plurality of conductive lines 142 interlaced with each other to form a net and located on the pixel regions 110a and a conductive frame 144 located in the peripheral region 110b. The conductive frame 144 surrounds and is electrically coupled to the conductive lines 142. Particularly, the conductive frame 144 may be in electrical contact with all of the conductive lines 142 and has the same electrical potential as those of the conductive lines 142. In the present embodiment, the conductive lines 142 and the conductive frame 144 may be located in the same film layer. However, the invention is not limited thereto.

It should not mentioned that the conductive frame 144 is in electrical contact with the constant voltage pad 132 within the peripheral region 110b, and a portion of at least one of the constant voltage lines VL completely within each of the pixel regions 110a is located in the each of the pixel regions 110a and is in electrical contact with at least one of the conductive lines 142. In the present embodiment, each of the pixel regions 110a covers one of first conductive lines 142a and one of second conductive lines 142b which are interlaced with each other, and the covered portion of the at least one of the constant voltage lines VL completely within the each of the pixel regions 110a may be in electrical contact with the one of the first conductive lines 142a, the one of the second conductive lines 142b, or a combination thereof. As shown in FIG. 1, the covered portion of one of the constant voltage lines VL completely within each of the pixel regions 110a is in electrical contact with one of the first conductive lines 142a. However, the invention is not limited thereto, and the covered portion of one of the constant voltage lines VL completely within each of the pixel regions 110a may also be in electrical contact with one of second conductive lines 142b or simultaneously in electrical contact with the first and second conductive lines 142a and 142b according to other embodiments of the invention.

In view of said electrical connection, the net-shaped conductive pattern 140 is able to lessen the difference in resistances between the constant voltage source 130 and the input electrodes Id of the driver transistors DTFT distributed onto the first substrate 110, and thereby the constant voltage respectively transmitted into the input electrode Id of each driver transistor DTFT does not vary significantly. Thereby, the conventional issue of unfavorable display quality caused by the significant difference in resistances between the input electrodes of the driver transistors and the constant voltage source can be better resolved.

Figure 2:
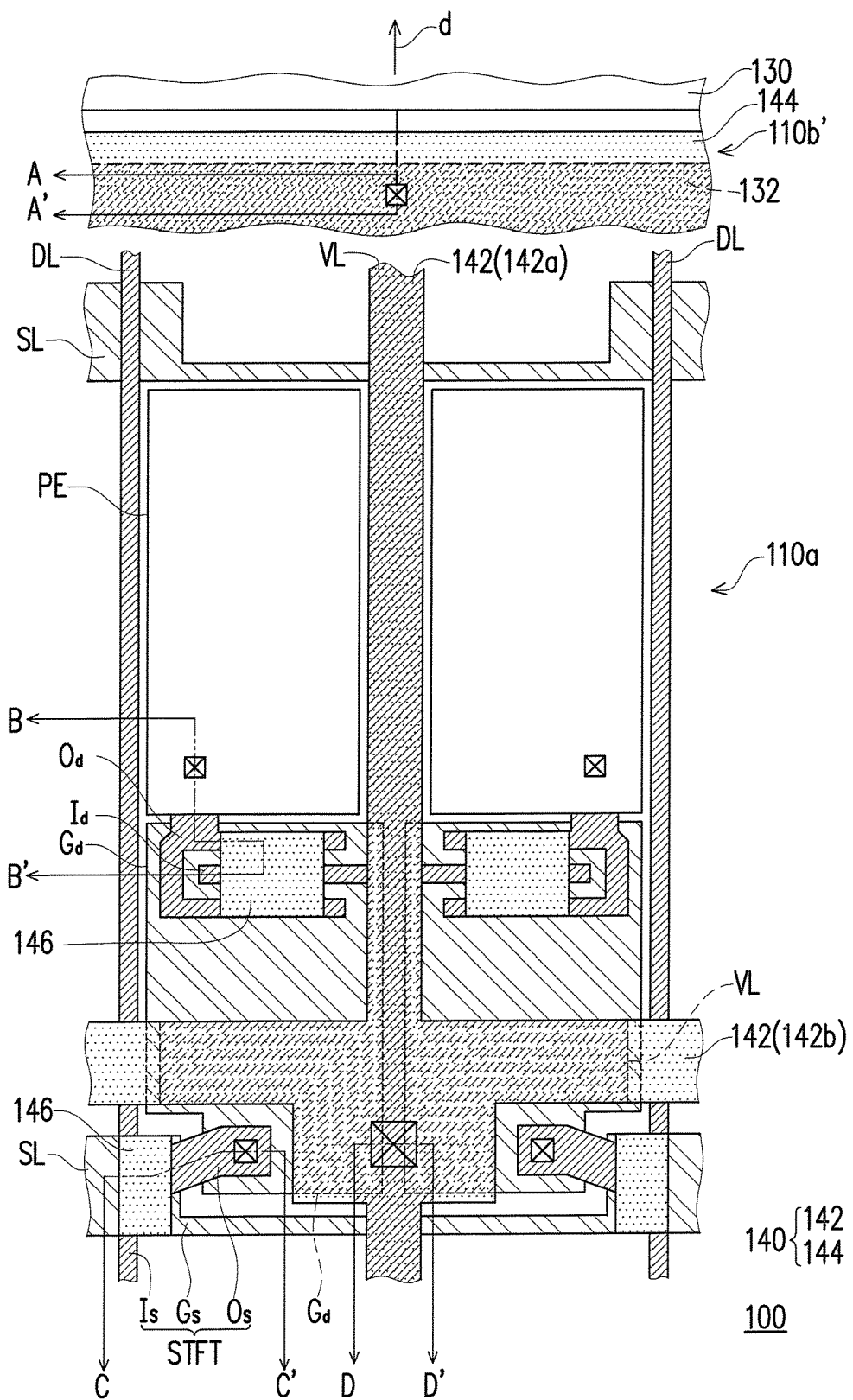
FIG. 2 is a schematic diagram illustrating one of the pixel regions and a portion of the peripheral region in the pixel array substrate according to the first embodiment of the invention.
Figure 3:
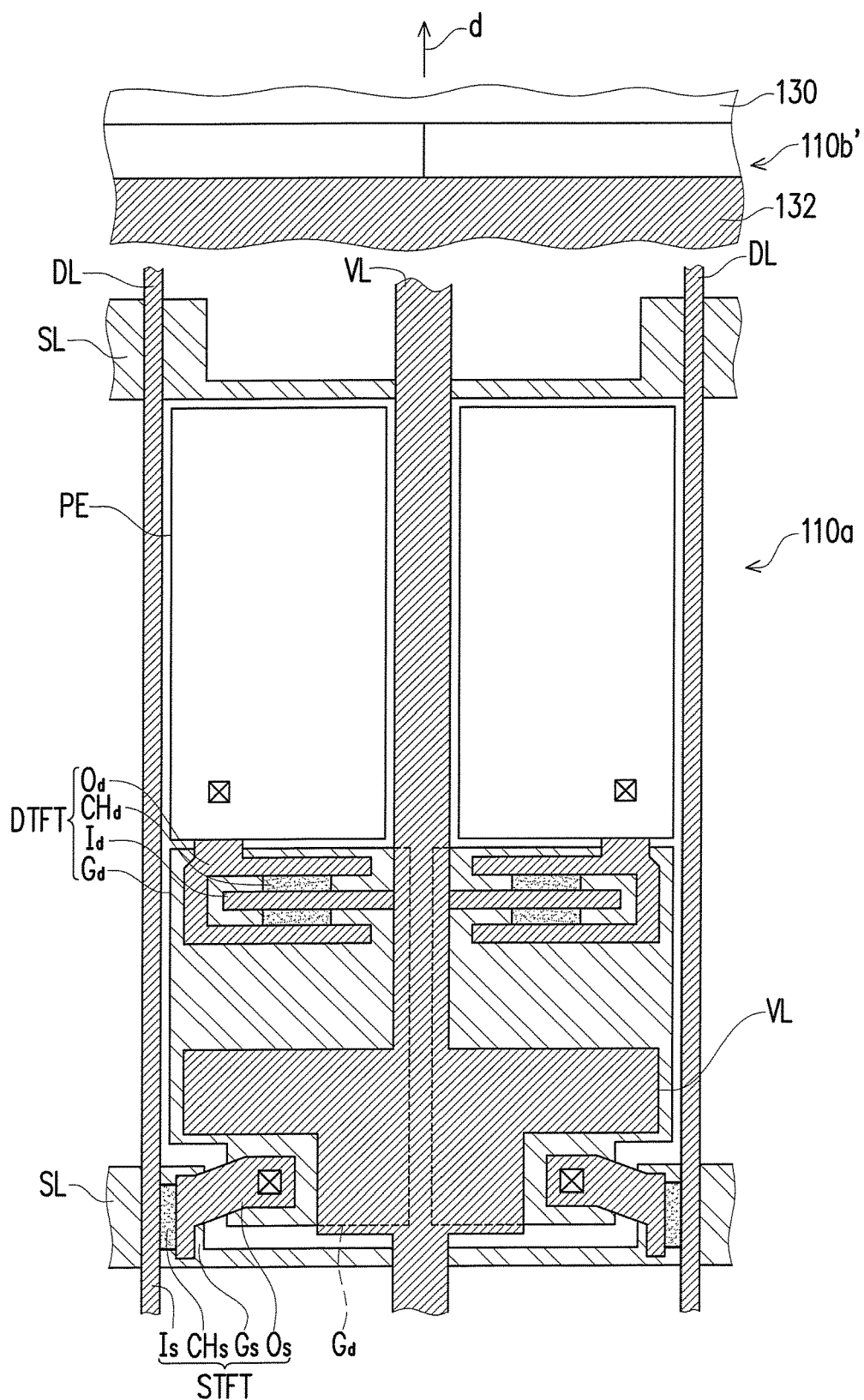
FIG. 3 illustrates film layers other than the film layer where the conductive pattern depicted in FIG. 2 is located.
Figure 4:
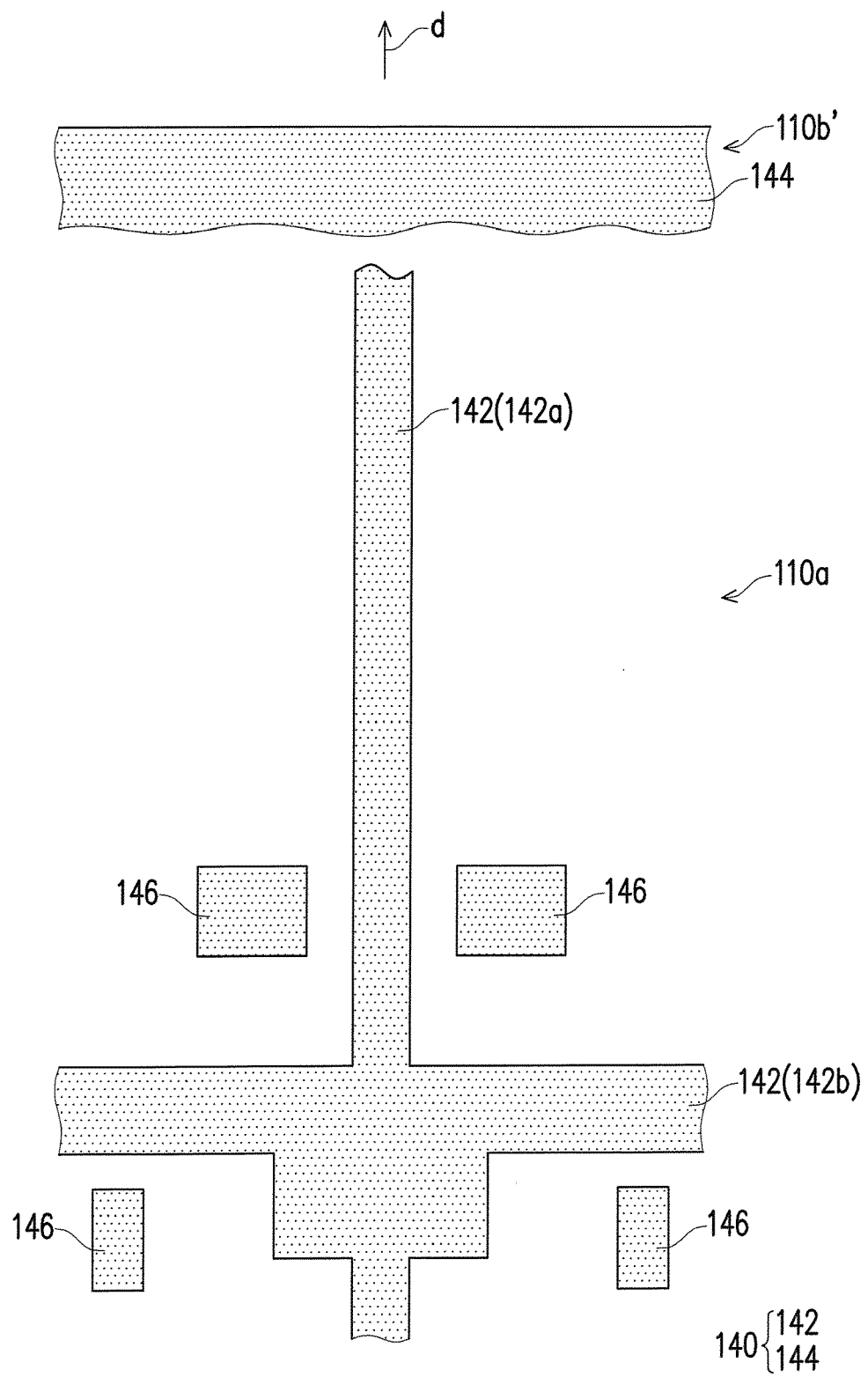
FIG. 4 illustrates the film layer where the conductive pattern depicted in FIG. 2 is located.

FIG. 2 is a schematic diagram illustrating one of the pixel regions and a portion of the peripheral region in the pixel array substrate according to the first embodiment of the invention. The pixel region 110a shown in FIG. 2 corresponds to the pixel region 110a surrounded by dotted lines in FIG. 1, and the portion of the peripheral region 110b' shown in FIG. 2 corresponds to the peripheral region 110b' surrounded by dotted lines in FIG. 1. FIG. 3 illustrates film layers other than the film layer where the conductive pattern depicted in FIG. 2 is located. FIG. 4 illustrates the film layer where the conductive pattern depicted in FIG. 2 is located. Note that FIG. 1 serves to explain the electrical connection among the components in the pixel array substrate, while the detailed structures of these components in the pixel array substrate are shown in FIG. 2, FIG. 3, and FIG. 4. The structures of these components in the pixel array will be elaborated hereinafter with reference to FIG. 2, FIG. 3, and FIG. 4.

As shown in FIG. 2, FIG. 3, and FIG. 4, in the present embodiment, the conductive lines 142 of the conductive pattern 140 and the constant voltage lines VL are overlapped. Specifically, the conductive lines 142 are divided into a plurality of first conductive lines 142a and a plurality of second conductive lines 142b, the first conductive lines 142a are parallel to extension directions d of the constant voltage lines VL, and the second conductive lines 142b are interlaced with the first conductive lines 142a. The constant voltage lines VL cover the first conductive lines 142a. The second conductive lines 142b may be overlapped with the control electrodes Gd of the driver transistors DTFT and the data lines DL. In brief, the area occupied by the conductive pattern 140 is mostly overlapped with the constant voltage lines VL and the control electrodes Gd of the driver transistors DTFT. Hence, when the aforesaid issue of unfavorable display quality is resolved by means of the conductive pattern 140, the aperture of the pixel array substrate 100 is not negatively affected to an excessive degree.

Figure 5:
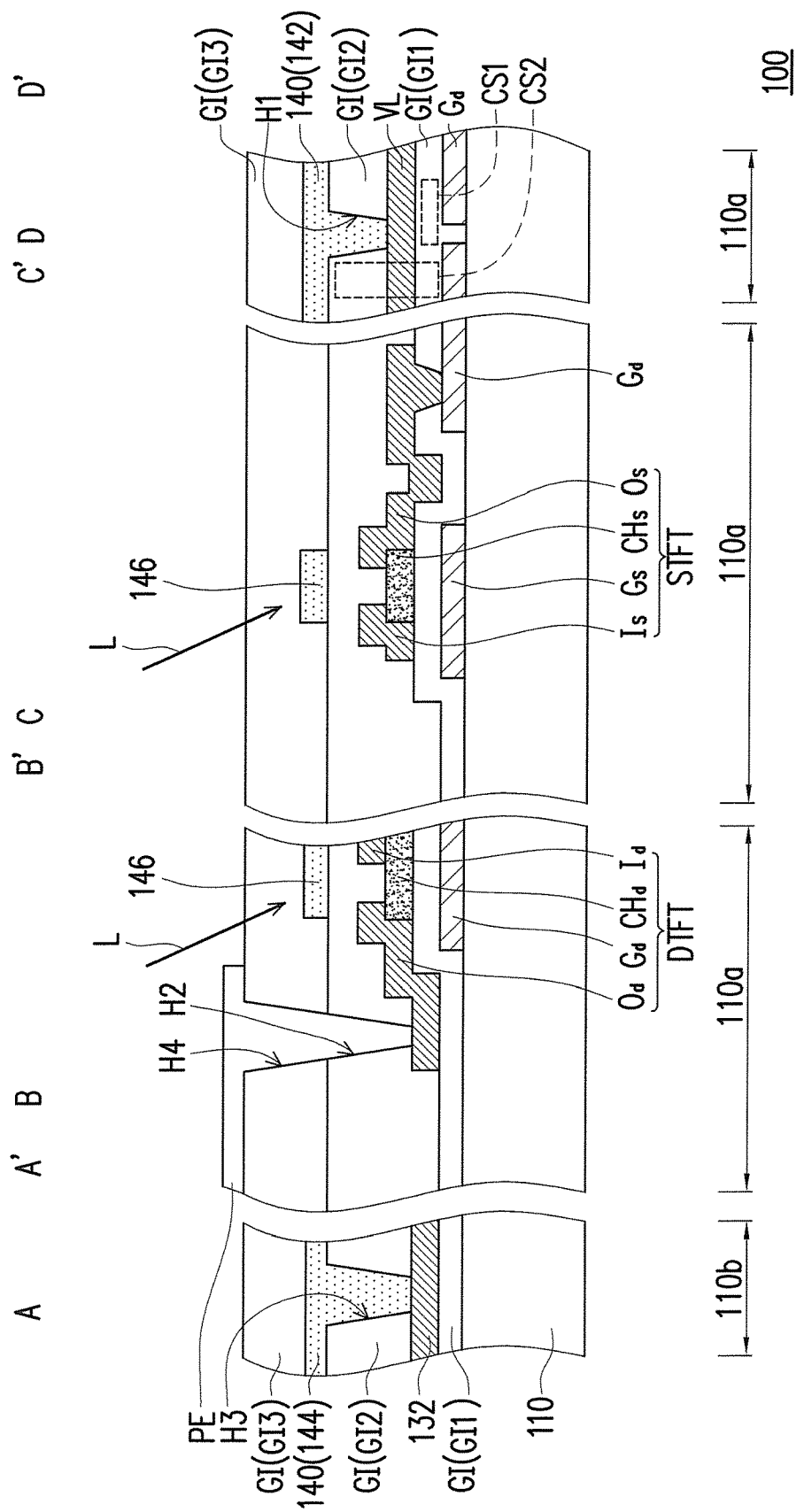
FIG. 5 is a schematic cross-sectional diagram illustrating the pixel array substrate depicted in FIG. 2 along sectional lines A-A', B-B', C-C', and D-D' according to the first embodiment of the invention.

In the present embodiment, the constant voltage line VL is overlapped with the control electrode Gd of the driver transistor DTFT of the pixel unit 120, so as to constitute a first storage capacitor CS1, which is shown in FIG. 5. One of the conductive lines 142 of the conductive pattern 140 is overlapped with the control electrode Gd of the driver transistor DTFT of the pixel unit 120, so as to constitute a second storage capacitor CS2, which is shown in FIG. 5 as well. The first storage capacitor CS1 and the second storage capacitor CS2 share the same capacitor electrode (i.e., the control electrode Gd of the driver transistor DTFT), and another capacitor electrode (i.e., the constant voltage line VL) of the first storage capacitor CS1 and another capacitor electrode (i.e., the conductive line 142) of the second storage capacitor CS2 have the same electrical potential. Therefore, the first storage capacitor CS1 and the second storage capacitor CS2 are connected in parallel to constitute a pixel storage capacitor of one of the pixel units 120. That is, the pixel storage capacitance of the pixel unit 120 is obtained by adding the first storage capacitance and the second storage capacitance. Thereby, the conductive pattern 140 (i.e., the capacitor electrode of the second storage capacitor) not only can resolve said issue of unfavorable display quality but also can increase the pixel storage capacitance of the pixel unit 120, such that the pixel array substrate 100 may have the improved performance.

FIG. 5 is a schematic cross-sectional diagram illustrating a pixel array substrate according to a first embodiment of the invention. Particularly, FIG. 5 corresponds to the sectional lines A-A', B-B' C-C', and D-D' depicted in FIG. 2. The relationship of the components in the pixel array will be elaborated hereinafter with reference to FIG. 2 and FIG. 5.

As shown in FIG. 2 and FIG. 5, in the present embodiment, the control electrodes Gd of the driver transistors DTFT, the control electrodes Gs of the switch transistors STFT, and the scan lines SL may be located in the same film layer. The pixel array substrate 100 described herein further includes an insulation layer GI (GI1) (shown in FIG. 5) that covers the control electrodes Gd and Gs and the scan lines SL. The film layers where the control electrodes Gd are located are between the insulation layer GI (GI1) and the first substrate 110. The driver transistors DTFT further include channels CHd that are overlapped with the control electrodes Gd. The switch transistors STFT further include channels CHs that are overlapped with the control electrodes Gs. The channels CHd of the driver transistors DTFT and the channels CHs of the switch transistors STFT may be located in the same film layer. The insulation layer GI (GI1) may be located between the film layers where the channels CHd are located and the film layers where the control electrodes Gd are located.

In the present embodiment, the input electrodes Id and the output electrodes Od of the driver transistors DTFT, the input electrodes Is and the output electrodes Os of the switch transistors STFT, the data lines DL, the constant voltage lines VL, and the constant voltage pad 132 may be located in the same film layer. The film layer where the channels CHd of the driver transistors DTFT are located is between the insulation layer GI1 and the film layer where the input electrodes Id of the driver transistors DTFT are located. However, the invention is not limited thereto, and the constant voltage pad 132 and the control electrodes Gd of the driver transistors DTFT or other components may be in the same film layer according to other embodiments of the invention.

The pixel array substrate 100 described herein further includes an insulation layer GI (GI2) (shown in FIG. 5) that covers the driver transistors DTFT, the switch transistors STFT, the data lines DL, and the constant voltage lines VL. The film layers where the input electrodes Id of the driver transistors DTFT are located are between the insulation layer GI (GI2) and the film layer where channels CHd are located. In each of the pixel regions 110a, a portion of the insulation layer GI (GI2) has a plurality of openings H1 to H3. The opening H1 is filled with the conductive lines 142 of the conductive pattern 140, such that the conductive lines 142 are in electrical contact with the constant voltage lines VL. The opening H2 is filled with the pixel electrode PE, such that the pixel electrode PE is in electrical contact with the output electrode Od of the driver transistor DTFT. In the peripheral region 110b, a portion of the insulation layer GI (GI2) has the opening H3. The opening H3 is filled with the conductive frame 144 of the conductive pattern 140, such that the conductive frame 144 is in electrical contact with the constant voltage pad 132 that outputs the constant voltage.

According to the present embodiment, the conductive pattern 140 is in the film layer different from the film layer where the output electrodes Od of the driver transistors DTFT, the input electrodes Id of the driver transistors DTFT, the control electrodes Gd of the driver transistors DTFT, and the pixel electrodes PE are located. Namely, the film layer where the insulation layer GI (GI2) is located may be between the film layer where the conductive pattern 140 is located and the film layers where the input electrodes Id of the driver transistors DTFT are located.

In the present embodiment, the pixel array substrate 100 further includes light-shielding patterns 146. The light-shielding patterns 146 respectively shield the channels CHs of the switch transistors STFT and the channels CHd of the driver transistors DTFT. In the present embodiment, the conductive frame 140 and the light-shielding patterns 146 may be located in the same film layer. As shown in FIG. 5, the light-shielding patterns 146 may shield the light beam L on top of the pixel electrode PE. That is, when the pixel array substrate 100 is a part of the OLED display, the light-shielding patterns 146 may shield the light beam from the OLED layer, and thereby the OLED display having the pixel array substrate 100 may have the improved performance.

The pixel array substrate 100 described herein further includes an insulation layer GI (GI3) that covers the conductive pattern 140 and the light-shielding patterns 146. The film layer where the conductive pattern 140 is located is between the insulation layer GI (GI3) and the insulation layer GI (GI2). The insulation layer GI (GI3) is located between the film layers where the pixel electrodes PE are located and the film layer where the conductive pattern 140 is located. The openings H2 and H4 of the insulation layers GI (GI2) and GI (GI3) are filled with the pixel electrodes PE, such that the pixel electrodes PE are in electrical contact with the output electrodes Od of the driver transistors DTFT.

In the present embodiment, the film layer where the control electrodes Gd of the driver transistors DTFT is located are between the first substrate 110 and the film layer where the input electrodes Id of the driver transistors DTFT are located, and the film layer where the input electrodes Id of the driver transistors DTFT are located is between the film layer where the conductive pattern 140 is located and the film layer where the control electrodes Gd of the driver transistors DTFT are located. That is, the driver transistors DTFT described herein may be bottom-gate transistors. In the present embodiment, the film layers where the components of the switch transistors STFT are located are the same as the film layers where the components of the driver transistors DTFT are located, and the switch transistors STFT described herein may be bottom-gate transistors as well. However, the invention is not limited thereto, and the driver transistors DTFT and the switch transistors STFT in other embodiments of the invention may be in another form.

Figure 6:
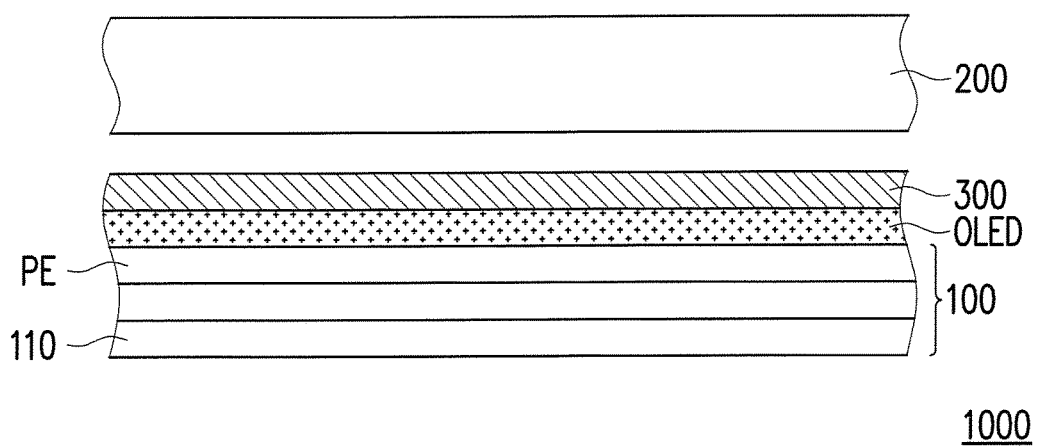
FIG. 6 is a schematic cross-sectional diagram illustrating an organic light-emitting diode (OLED) display according to the first embodiment of the invention.

FIG. 6 is a schematic cross-sectional diagram illustrating an OLED display according to the first embodiment of the invention. With reference to FIG. 6, the OLED display 1000 includes the pixel array substrate 100, a second substrate 200 opposite to the first substrate 110, an OLED layer OLED located between the pixel electrodes PE and the second substrate 200, and a common electrode layer 300 located between the second substrate 200 and the OLED layer OLED. Since the OLED display 1000 employs the pixel array substrate 100, the OLED display 1000 is also able to resolve the conventional issue of unfavorable display quality caused by the significant difference in resistances between the input electrodes of the driver transistors and the constant voltage source.

Second Embodiment

Figure 7:
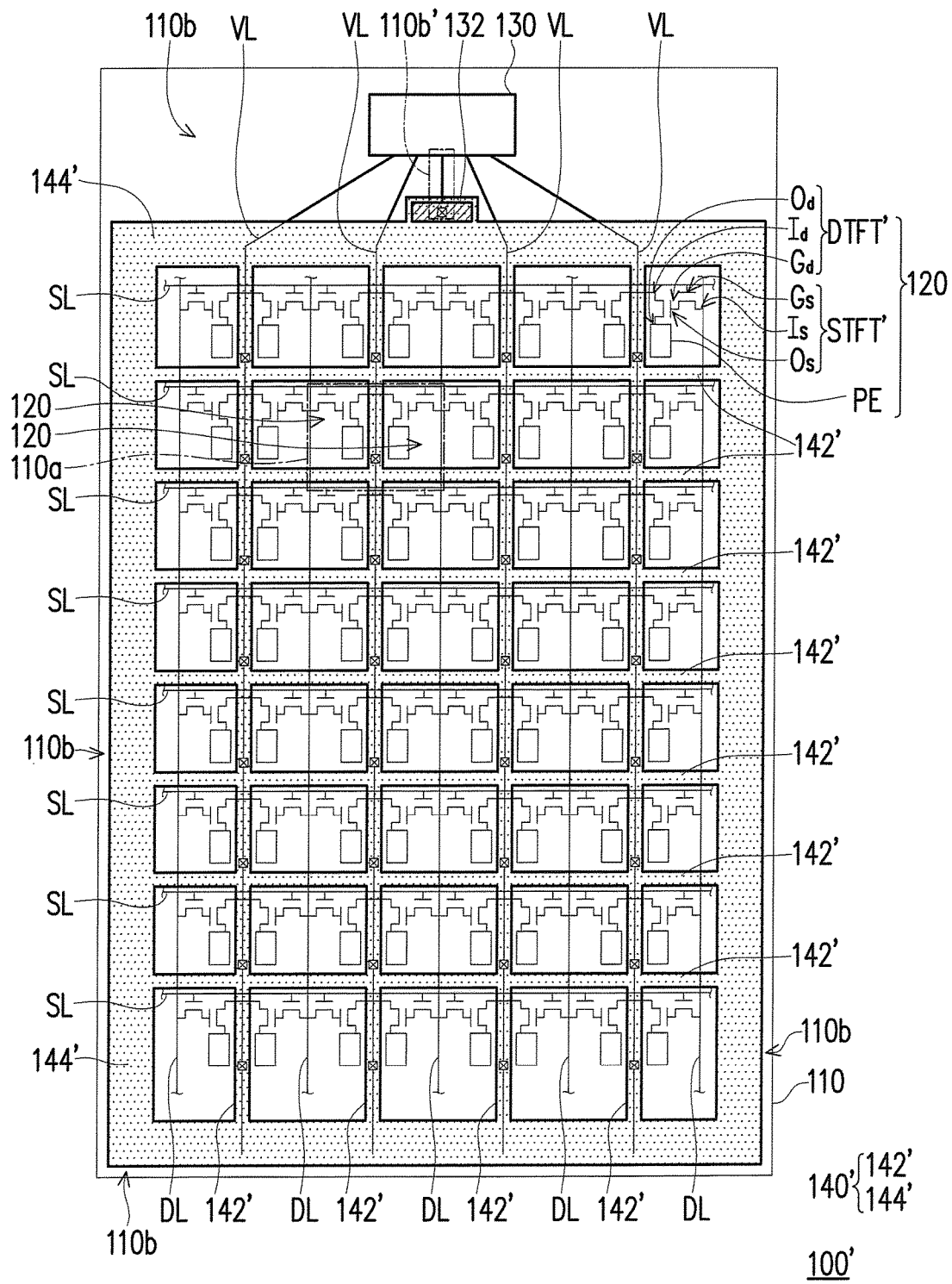
FIG. 7 is a schematic diagram illustrating a pixel array substrate according to a second embodiment of the invention.

FIG. 7 is a schematic diagram illustrating a pixel array substrate according to a second embodiment of the invention. With reference to FIG. 7, the pixel array substrate 100' described in the present embodiment is similar to the pixel array substrate 100 described in the first embodiment, and thus the same and corresponding components of the two pixel array substrates 100 and 100' are represented by the same or corresponding reference numbers. The difference between the pixel array substrate 100' and the pixel array substrate 100 lies in that the types of the driver transistors DTFT' and the switch transistors STFT' of the pixel array substrate 100' are different from those of the driver transistors DTFT and the switch transistors STFT of the pixel array substrate 100, and the relative relationship between the conductive pattern 140' and other film layers is also different from that between the conductive pattern 140 and other film layers. Said difference will be demonstrated below, while the similarity will not be further described.

With reference to FIG. 7, similar to the pixel array substrate 100 described in the first embodiment, the pixel array substrate 100' described herein includes a first substrate 110, a plurality of pixel units 120, a plurality of data lines DL, a plurality of scan lines SL, a plurality of constant voltage lines VL, a constant voltage source 130, and a constant voltage pad 132. The first substrate 110 has a plurality of pixel regions 110a arranged in an array and a peripheral region 110b surrounding the pixel regions 110a. The pixel units 120 are located in the pixel regions 110a. Each of the pixel units 120 includes a switch transistor STFT, a driver transistor DTFT, and a pixel electrode PE. The switch transistor STFT has an input electrode Is, a control electrode Gs, and an output electrode Os; the driver transistor DTFT has an input electrode Id, a control electrode Gd, and an output electrode Od. The output electrode Os of the switch transistor STFT is electrically coupled to the control electrode Gd of the driver transistor DTFT. The pixel electrode PE is electrically coupled to the output electrode Od of the driver transistor DTFT. The data lines DL are located on the first substrate 110 and electrically coupled to the input electrodes Is of the switch transistors STFT. The scan lines SL are located on the first substrate 110, interlaced with the data lines DL, and electrically coupled to the control electrodes Gs of the switch transistors STFT. The constant voltage lines VL are located on the first substrate 110 and electrically coupled to the input electrodes Id of the driver transistors DTFT. The constant voltage source 130 is located on the peripheral region 110b of the first substrate 110 and provides a constant voltage to the constant voltage lines VL. The constant voltage pad 132 is located on the peripheral region 110b of the first substrate 110 and outputs the constant voltage provided by the constant voltage source 130.

The pixel array substrate 100' also includes a conductive pattern 140' located on the first substrate 110. The conductive pattern 140' includes a plurality of conductive lines 142' interlaced with each other to form a net and located on the pixel regions 110a and a conductive frame 144' located in the peripheral region 110b. The conductive frame 144' surrounds and is electrically coupled to all of the conductive lines 142'. The conductive frame 144' is in electrical contact with the constant voltage pad 132 within the peripheral region 110b. Each of the pixel regions 110a is defined by two adjacent scan lines SL and two adjacent data lines DL. Besides, each of the pixel regions 110a covers at least one of the pixel units 120 and a portion of at least one of the constant voltage lines VL. The covered portion of the at least one of the constant voltage lines VL located completely within each of the pixel regions 110a is in electrical contact with at least one of the conductive lines 142' within the pixel region 110a.

Figure 8:
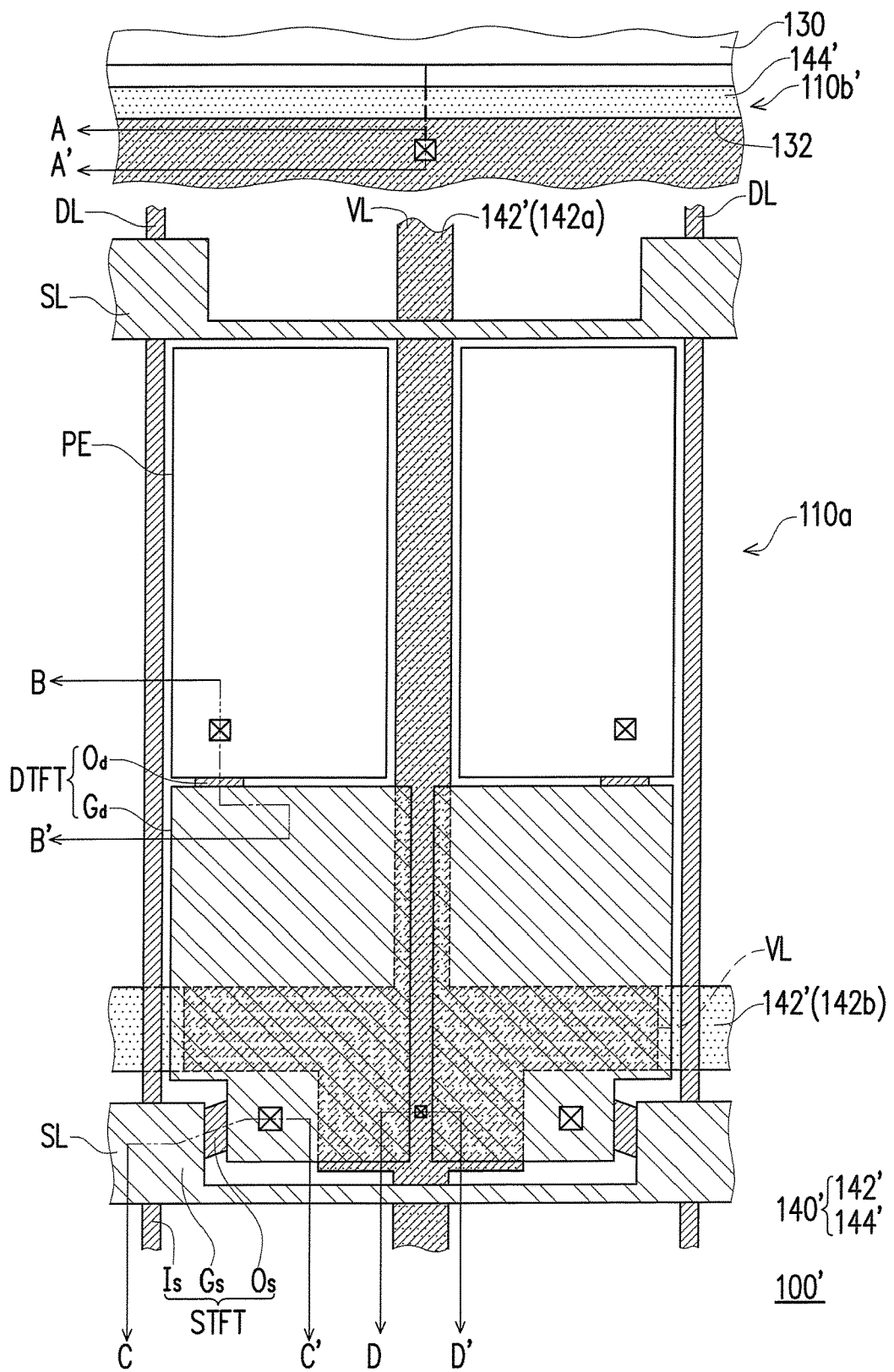
FIG. 8 is a schematic diagram illustrating one of the pixel regions and a portion of the peripheral region in the pixel array substrate according to the second embodiment of the invention.
Figure 9:
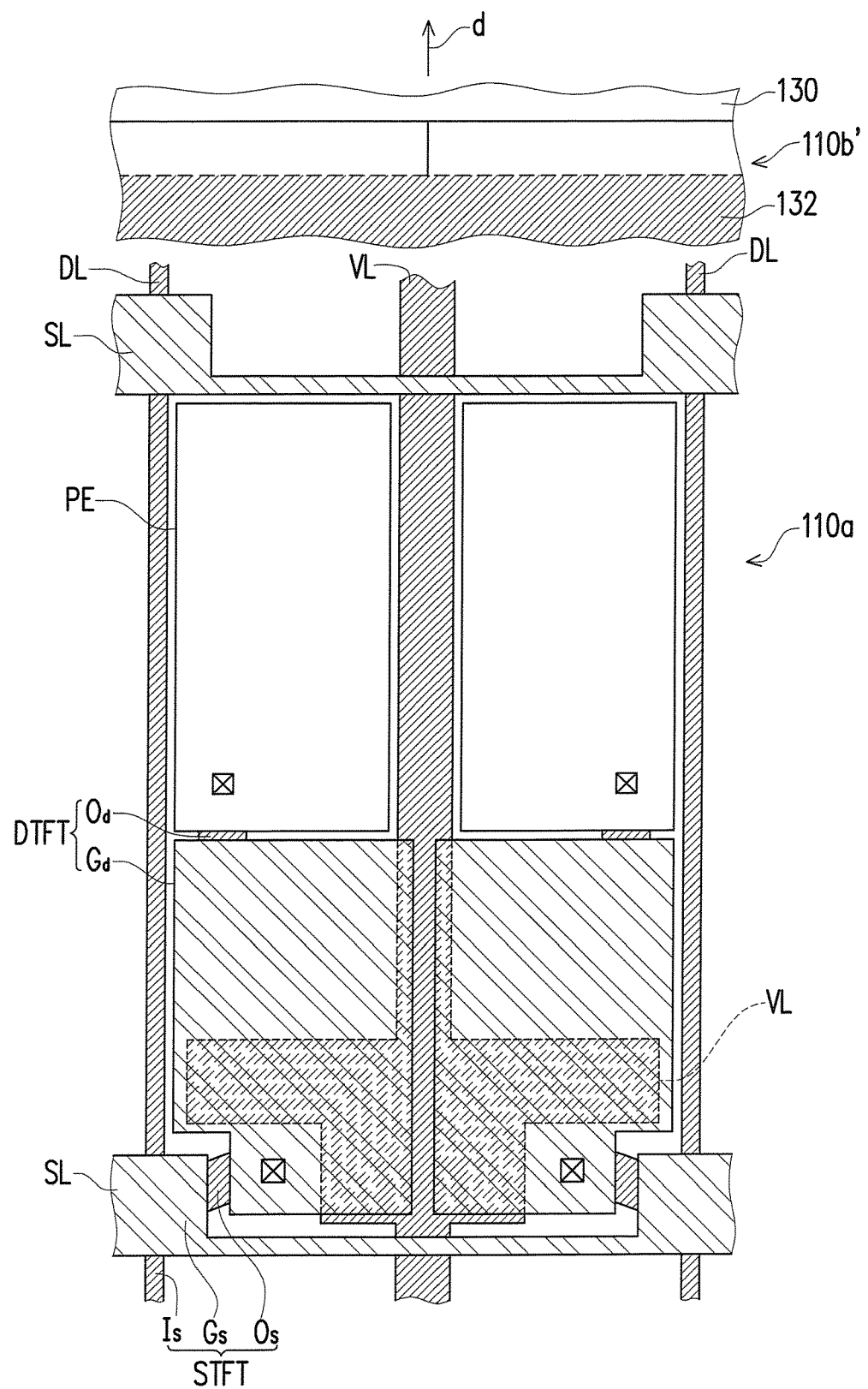
FIG. 9 illustrates film layers other than the film layer where the conductive pattern depicted in FIG. 8 is located.
Figure 10:
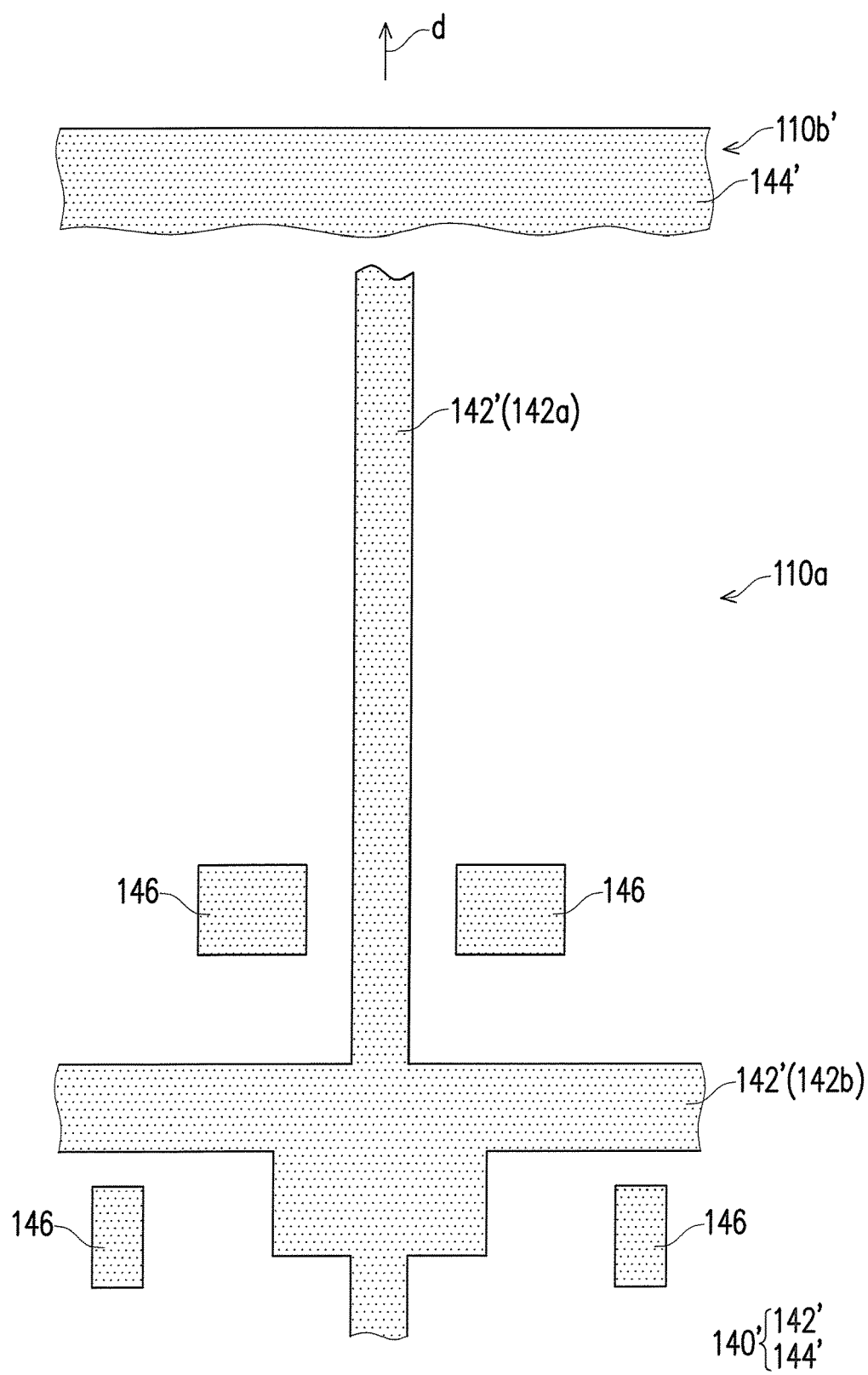
FIG. 10 illustrates the film layer where the conductive pattern depicted in FIG. 8 is located.
Figure 11:
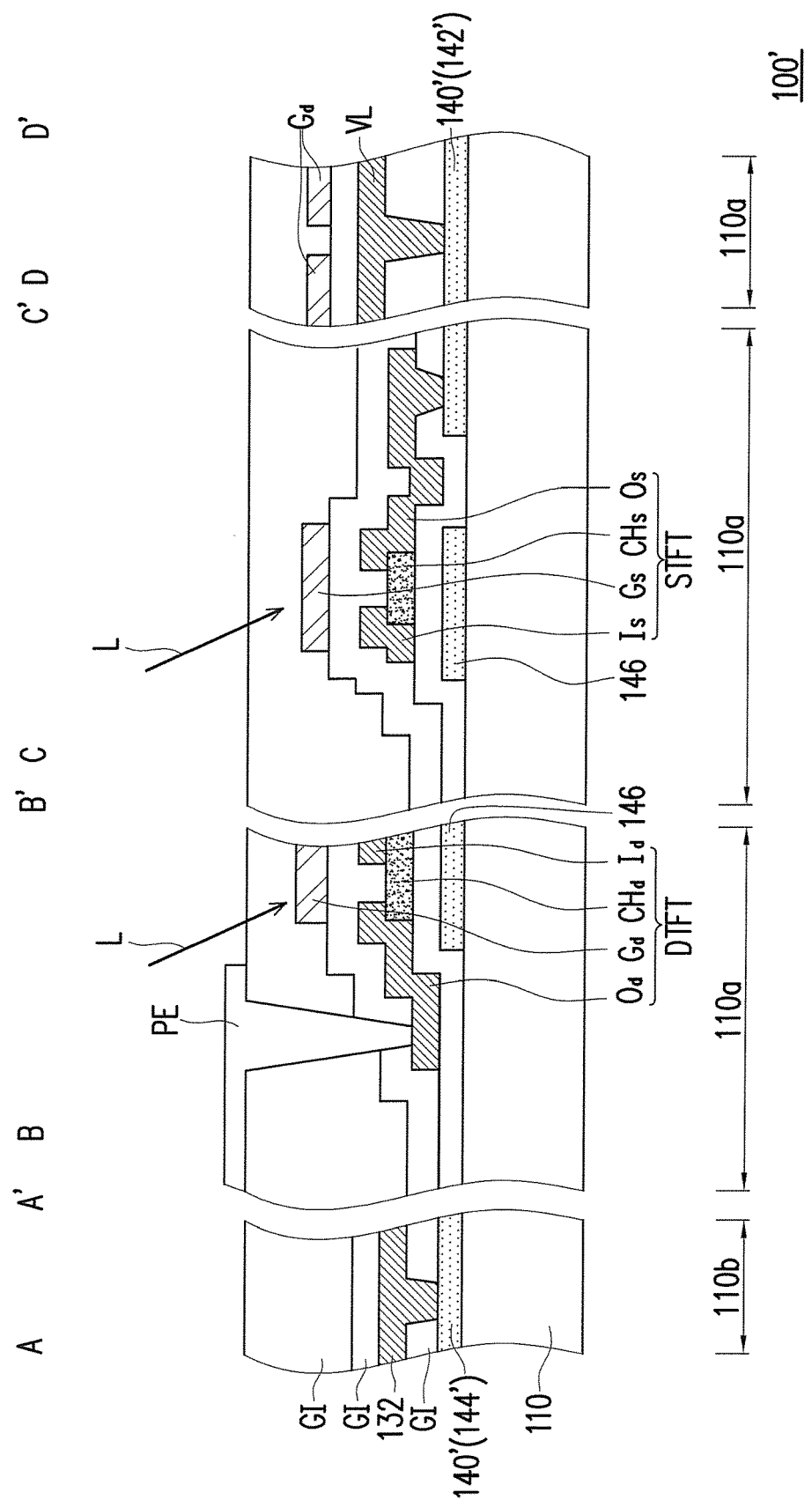
FIG. 11 is a schematic cross-sectional diagram illustrating the pixel array substrate depicted in FIG. 8 along sectional lines A-A', B-B', C-C', and D-D' according to the second embodiment of the invention.

FIG. 8 is a schematic diagram illustrating one of the pixel regions and a portion of the peripheral region in the pixel array substrate according to the second embodiment of the invention. The pixel region 110a shown in FIG. 8 corresponds to the pixel region 110a surrounded by dotted lines in FIG. 7, and the portion of the peripheral region 110b' shown in FIG. 8 corresponds to the peripheral region 110b' surrounded by dotted lines in FIG. 1. FIG. 9 illustrates film layers other than the film layer where the conductive pattern depicted in FIG. 8 is located. FIG. 10 illustrates the film layer where the conductive pattern depicted in FIG. 8 is located. FIG. 11 is a schematic cross-sectional diagram illustrating a pixel array substrate according to a second embodiment of the invention. Particularly, FIG. 11 corresponds to the sectional lines A-A', B-B' C-C', and D-D' depicted in FIG. 8. Note that FIG. 7 serves to explain the electrical connection among the components in the pixel array substrate, while the detailed structures of these components in the pixel array substrate are shown in FIG. 8, FIG. 9, and FIG. 10. The structures of these components in the pixel array will be elaborated hereinafter with reference to FIG. 8, FIG. 9, FIG. 10, and FIG. 11.

The difference between the first embodiment and the present embodiment lies in that the film layer where the conductive pattern 140' is located is between the first substrate 110 and the film layer where the input electrodes Id of the driver transistors DTFT' are located, and the film layer where the input electrodes Id of the driver transistors DTFT' are located is between the film layer where the conductive pattern 140' is located and the film layer where the control electrodes Gd of the driver transistors DTFT' are located. That is, the driver transistors DTFT' described herein may be top-gate transistors. In the present embodiment, the film layers where the components of the switch transistors STFT' are located are the same as the film layers where the components of the driver transistors DTFT' are located, and the switch transistors STFT' described herein may be top-gate transistors as well.

Figure 12:
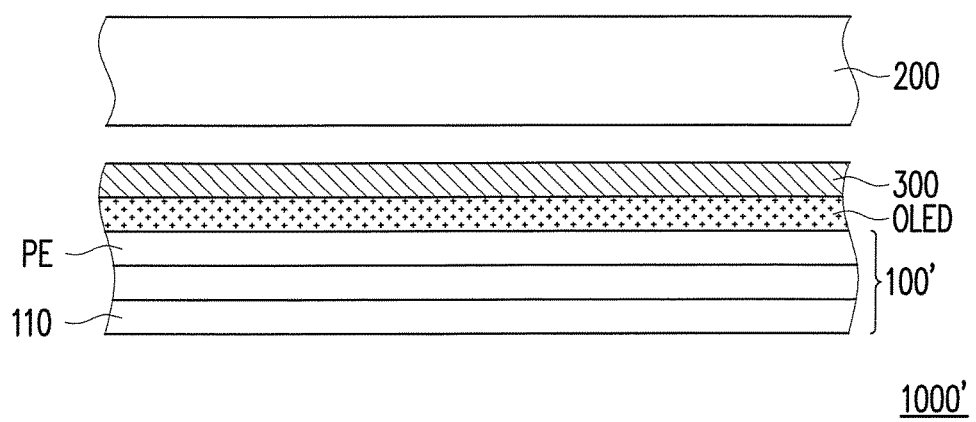
FIG. 12 is a schematic cross-sectional diagram illustrating an OLED display according to the second embodiment of the invention.

FIG. 12 is a schematic cross-sectional diagram illustrating an OLED display according to the second embodiment of the invention. With reference to FIG. 12, the OLED display 1000' includes the pixel array substrate 100', a second substrate 200 opposite to the first substrate 110, an OLED layer OLED located between the pixel electrodes PE and the second substrate 200, and a common electrode layer 300 located between the second substrate 200 and the OLED layer OLED. Since the effects and advantages of the OLED display 1000' and the pixel array substrate 100' are similar to those of the OLED display 1000 and the pixel array substrate 100, no further description is provided hereinafter.

Third Embodiment

Figure 13:
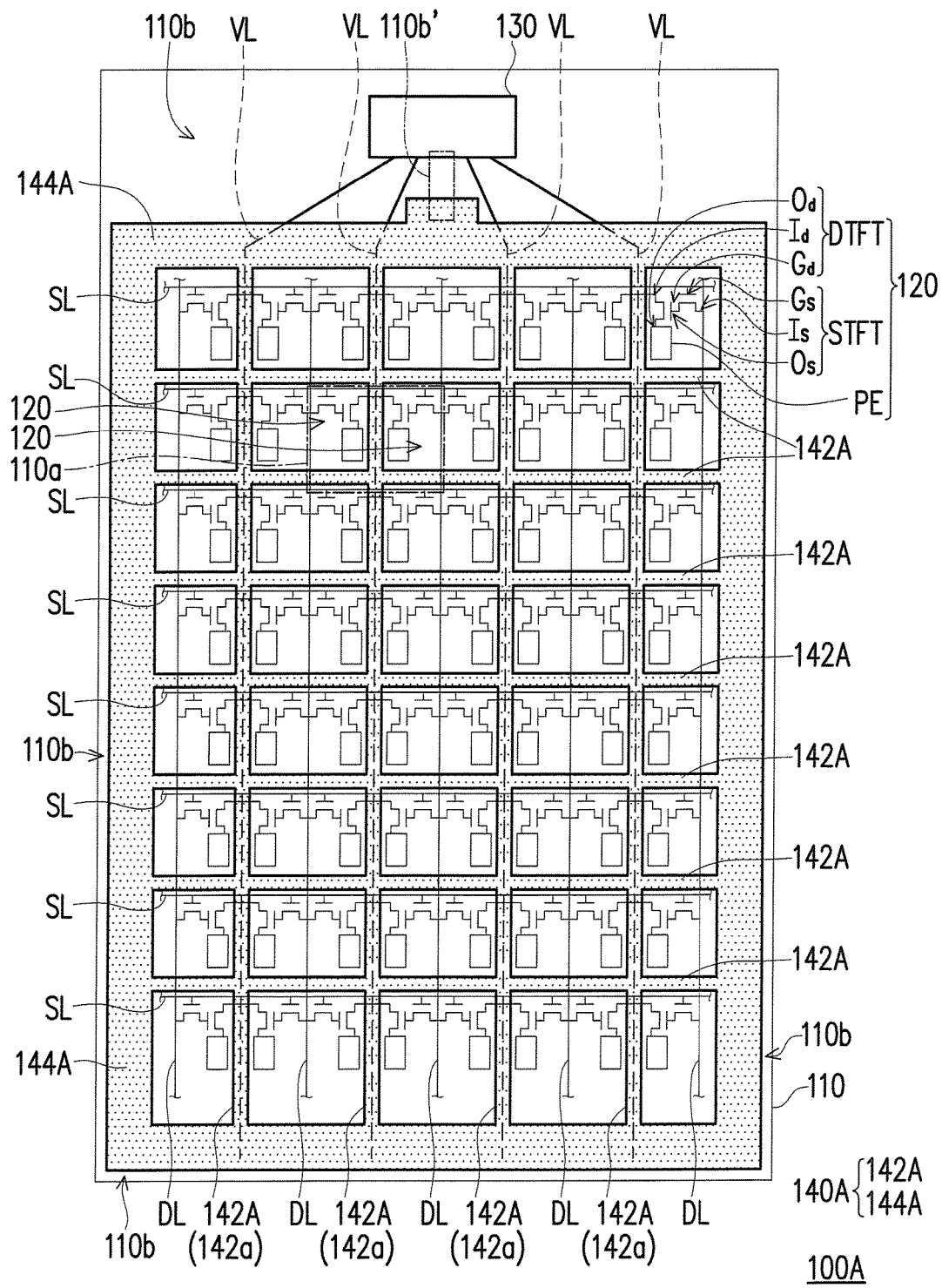
FIG. 13 is a schematic diagram illustrating a pixel array substrate according to a third embodiment of the invention.
Figure 14:
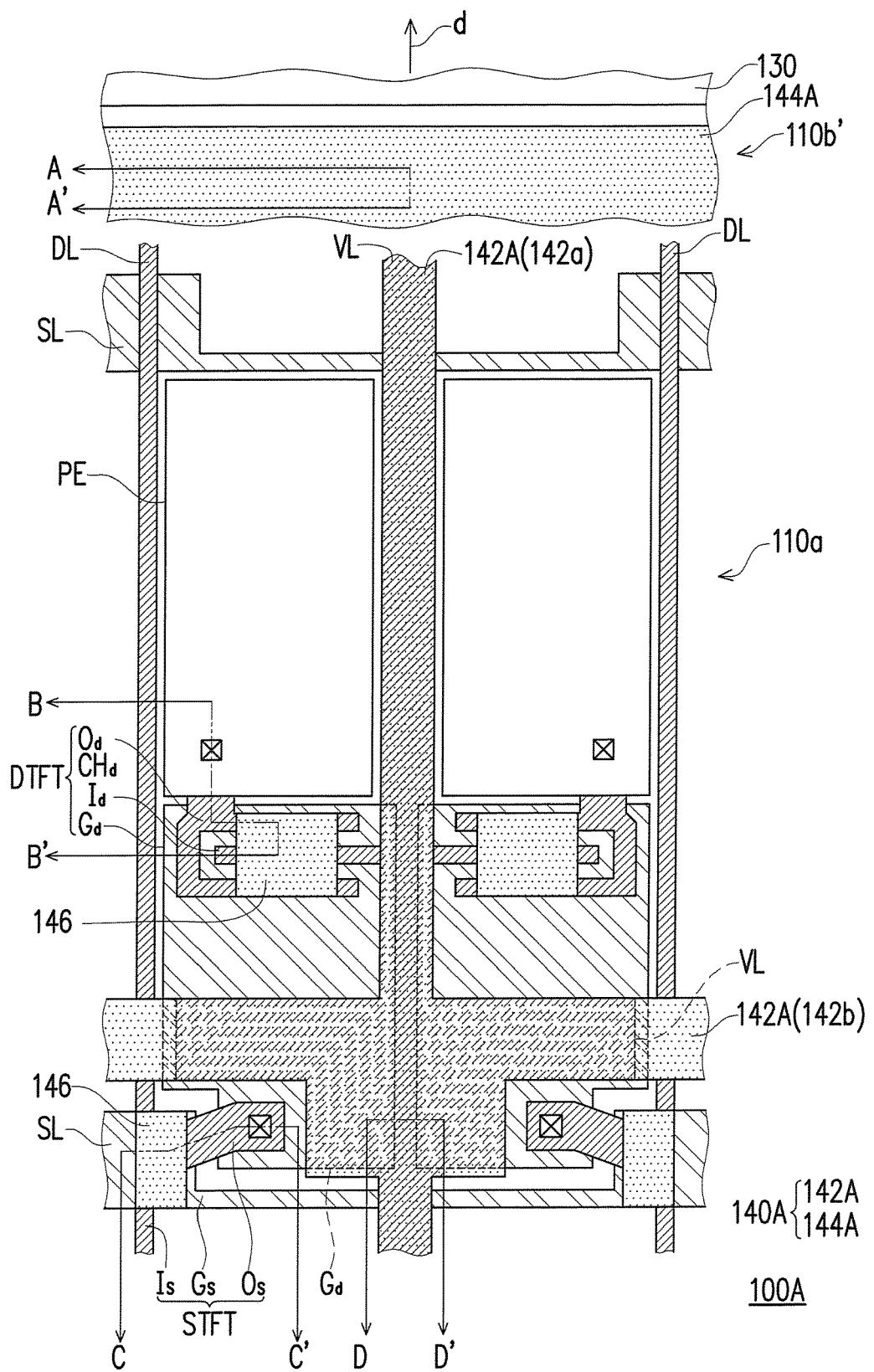
FIG. 14 is a schematic diagram illustrating one of the pixel regions and a portion of the peripheral region in the pixel array substrate according to the third embodiment of the invention.
Figure 15:
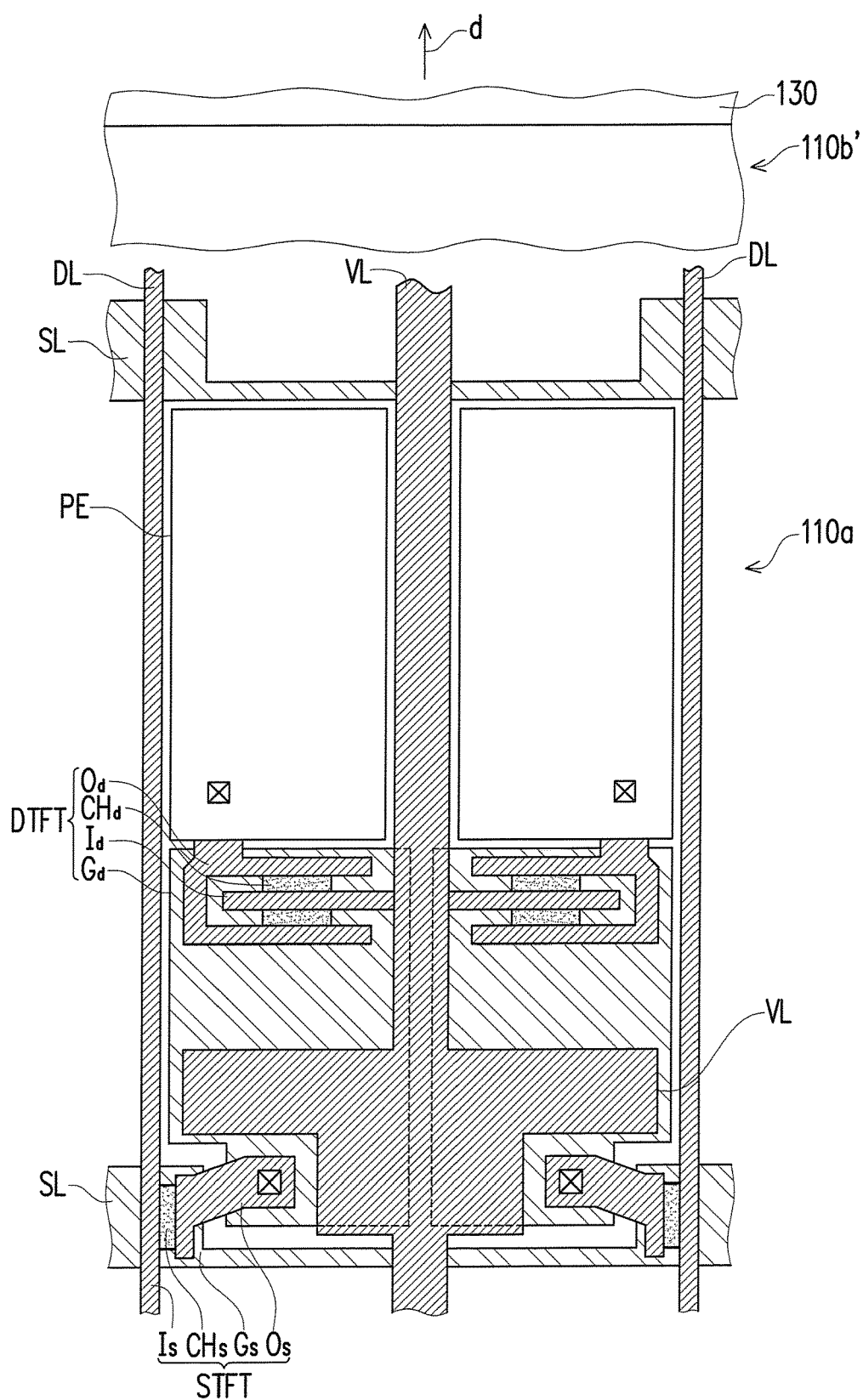
FIG. 15 illustrates film layers other than the film layer where the conductive pattern depicted in FIG. 14 is located.
Figure 16:
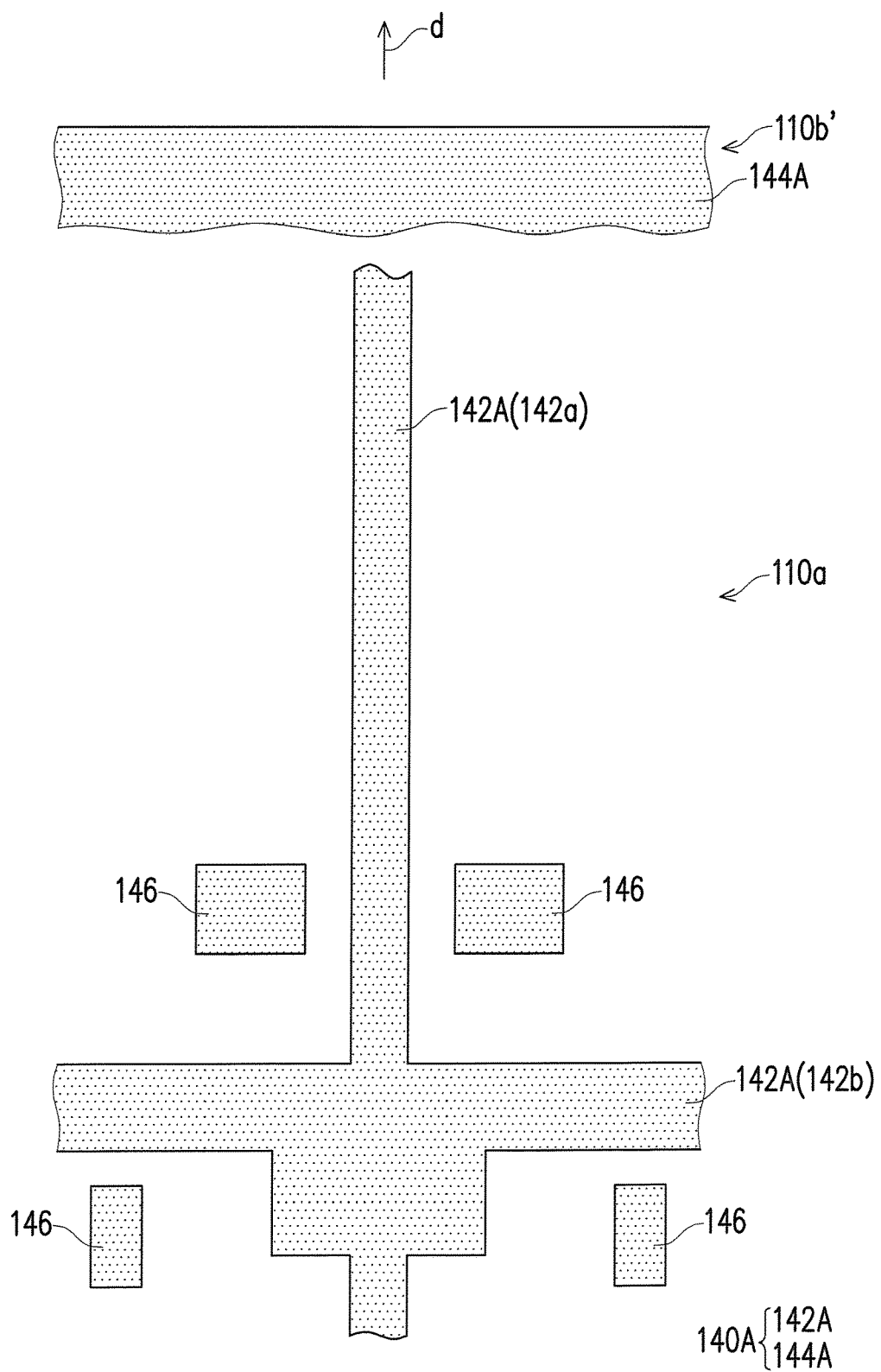
FIG. 16 illustrates the film layer where the conductive pattern depicted in FIG. 14 is located.
Figure 17:
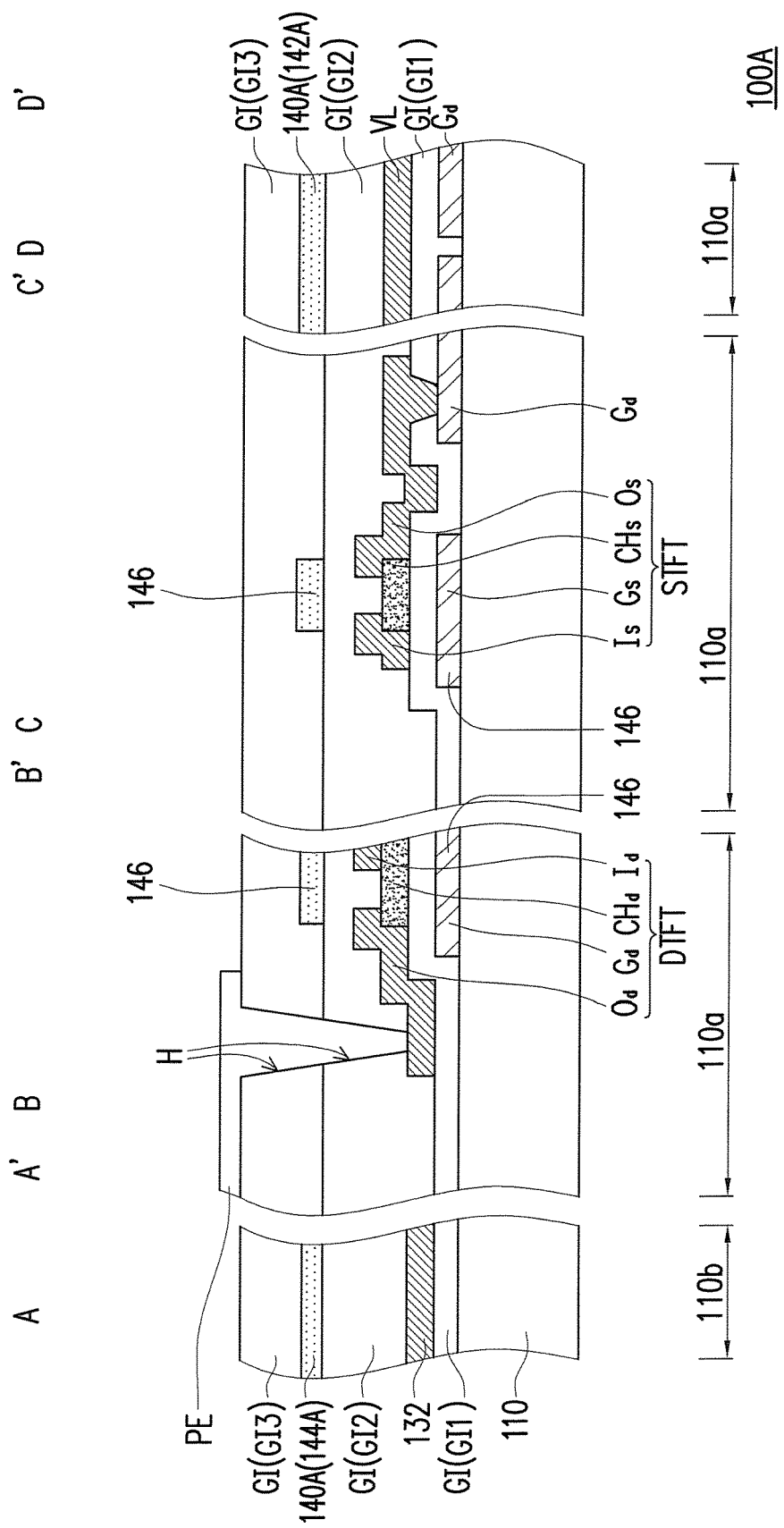
FIG. 17 is a schematic cross-sectional diagram illustrating the pixel array substrate depicted in FIG. 14 along sectional lines A-A', B-B', C-C', and D-D' according to the third embodiment of the invention.

FIG. 13 is a schematic diagram illustrating a pixel array substrate according to a third embodiment of the invention. FIG. 14 is a schematic diagram illustrating one of the pixel regions and a portion of the peripheral region in the pixel array substrate according to the third embodiment of the invention. The pixel region 110a shown in FIG. 14 corresponds to the pixel region 110a surrounded by dotted lines in FIG. 13, and the portion of the peripheral region 110b' shown in FIG. 14 corresponds to the peripheral region 110b' surrounded by dotted lines in FIG. 13. FIG. 15 illustrates film layers other than the film layer where the conductive pattern depicted in FIG. 14 is located. FIG. 16 illustrates the film layer where the conductive pattern depicted in FIG. 14 is located. FIG. 17 is a schematic cross-sectional diagram illustrating a pixel array substrate according to a third embodiment of the invention. Particularly, FIG. 17 corresponds to the sectional lines A-A', B-B' C-C', and D-D' depicted in FIG. 14. Note that FIG. 13 serves to explain the electrical connection among the components in the pixel array substrate, while the detailed structures of these components in the pixel array substrate are shown in FIG. 14, FIG. 15, FIG. 16, and FIG. 17.

With reference to FIG. 13, FIG. 14, FIG. 15, FIG. 16, and FIG. 17, the pixel array substrate 100A described in the present embodiment is similar to the pixel array substrate 100 described in the first embodiment, and thus the same and corresponding components of the two pixel array substrates 100 and 100A are represented by the same or corresponding reference numbers. The difference between the two pixel array substrates 100 and 100A lies in that the conductive pattern 140A is electrically insulated from the constant voltage lines VL in the pixel array substrate 100A. Said difference will be demonstrated below, while the similarity will not be further described.

The pixel array substrate 100A described in the present embodiment includes a first substrate 110, a plurality of pixel units 120 located on the first substrate 110, a plurality of data lines DL located on the first substrate 110, a plurality of scan lines SL located on the first substrate 110 and interlaced with the data lines DL, a plurality of constant voltage lines VL located on the first substrate 110 and interlaced with the scan lines SL, a constant voltage source 130 located on the peripheral region 110b of the first substrate 110, and the conductive pattern 140A. The constant voltage source 130 provides a constant voltage to the constant voltage lines VL.

The first substrate 110 has a plurality of pixel regions 110a arranged in an array and a peripheral region 110b surrounding the pixel regions 110a. The pixel units 120 are located in the pixel regions 110a. Each of the pixel regions 110a is defined by two adjacent scan lines SL and two adjacent data lines DL interlaced with the two scan lines SL. The pixel units 120 are located in the pixel regions 110a. Each of the pixel regions 110a includes at least one of the pixel units 120. Each of the pixel units 120 includes a switch transistor STFT, a driver transistor DTFT, and a pixel electrode PE. The switch transistor STFT has an input electrode Is, a control electrode Gs, and an output electrode Os; the driver transistor DTFT has an input electrode Id, a control electrode Gd, and an output electrode Od. The output electrode Os of the switch transistor STFT is electrically coupled to the control electrode Gd of the driver transistor DTFT. The pixel electrode PE is electrically coupled to the output electrode Od of the driver transistor DTFT. The data lines DL are electrically coupled to the input electrodes Is of the switch transistors STFT. The scan lines SL are electrically coupled to the control electrodes Gs of the switch transistors STFT. The constant voltage lines VL are electrically coupled to the input electrodes Id of the driver transistors DTFT.

The conductive pattern 140A is similar to the conductive pattern 140 described in the first embodiment. Specifically, from the direction perpendicular to the first substrate 110, it can be observed that the relative positions of the conductive pattern 140A and other components of the pixel array substrate 100A are the same as those of the conductive pattern 140 and other components of the pixel array substrate 100. The film layers where the conductive pattern 140A and other components of the pixel array substrate 100A are located and the film layers where the conductive pattern 140 and other components of the pixel array substrate 100 are located are arranged in the same order. The difference between the conductive pattern 140A and the conductive pattern 140 lies in that the conductive pattern 140A is not in electrical contact with the constant voltage lines VL, while the conductive pattern 140 is in electrical contact with the constant voltage lines VL. Specifically, the conductive pattern 140A also includes a plurality of conductive lines 142A and a conductive frame 144A. The difference between the conductive frame 144A described in the present embodiment and the conductive frame 144 described in the first embodiment lies in that the conductive frame 144A is not electrically connected to the constant voltage lines VL nor electrically connected to the constant voltage source 130. The difference between the conductive lines 142A described in the present embodiment and the conductive lines 142 described in the first embodiment lies in that the conductive lines 142A are not electrically connected to the constant voltage lines VL nor electrically connected to the constant voltage source 130.

Figure 18:
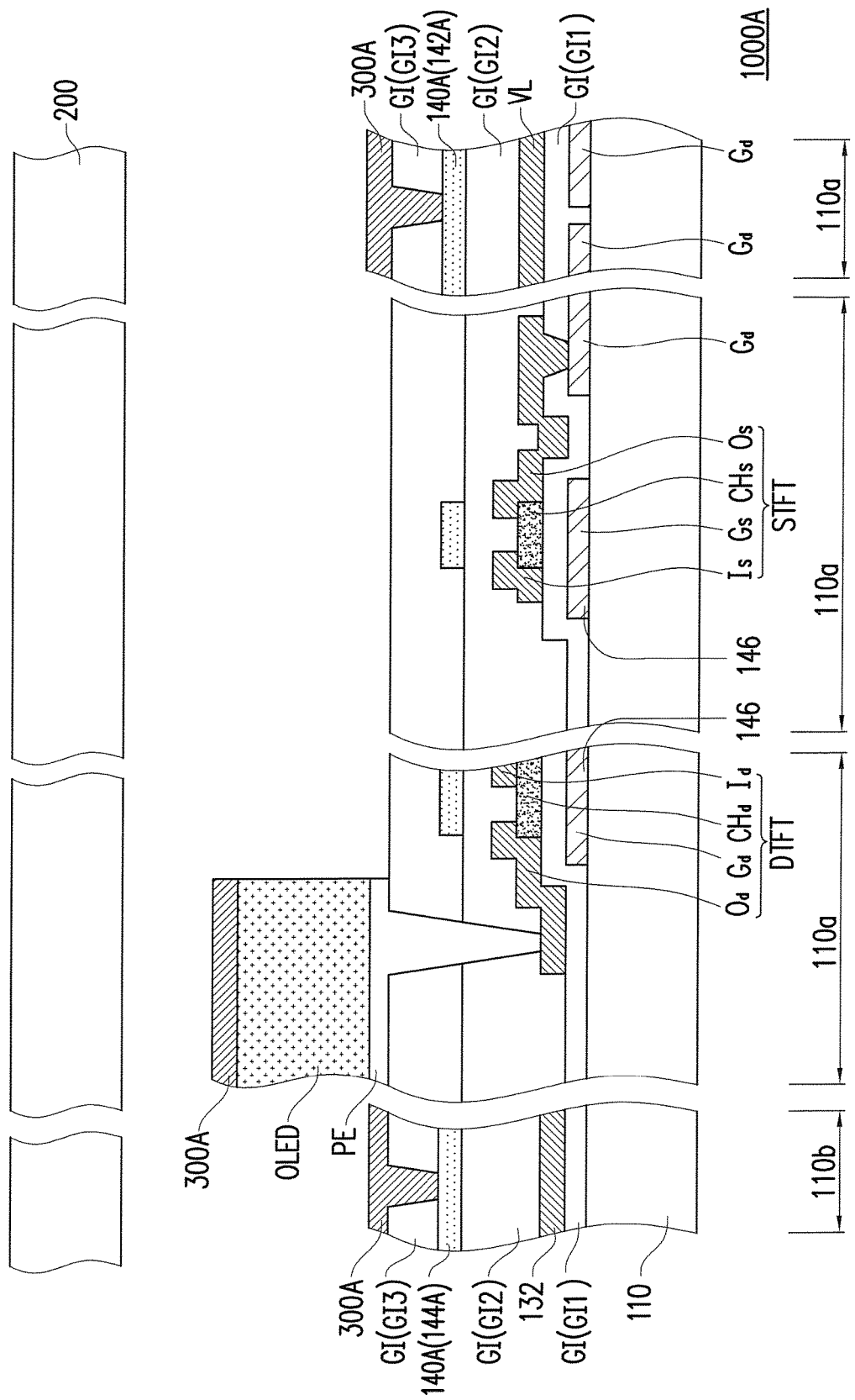
FIG. 18 is a schematic cross-sectional diagram illustrating an OLED display according to the third embodiment of the invention.

FIG. 18 is a schematic cross-sectional diagram illustrating an OLED display according to the third embodiment of the invention. With reference to FIG. 18, the OLED display 1000A includes the pixel array substrate 100A depicted in FIG. 17, a second substrate 200 opposite to the first substrate 110, an OLED layer OLED located between the pixel electrodes PE and the second substrate 200, and a common electrode layer 300A located between the second substrate 200 and the OLED layer OLED.

The common electrode layer 300A is overlapped with the control electrodes Gd of the driver transistors DTFT. The film layer where the control electrode Gd of each of the driver transistors DTFT is located is between the first substrate 110 and the film layer where the input electrode Id of each of the driver transistors DTFT is located. The film layer where the input electrode Id of each driver transistor DTFT is located is between a film layer where the conductive pattern 140A is located and the film layer where the control electrode Gd of each driver transistor DTFT is located. The film layer where the conductive pattern 140A is located is between the OLED layer OLED and the film layer where the input electrode Id of each driver transistor DTFT is located.

It should be mentioned that the conductive pattern 140A is in electrical contact with the common electrode layer 300A. The common electrode layer 300A is overlapped with the control electrode Gd of the driver transistor DTFT of one of the pixel units 120 to constitute a first storage capacitor. A portion of the conductive pattern 140A is overlapped with the control electrode Gd of the driver transistor DTFT of one of the pixel units 120 (shown in FIG. 14), so as to constitute a second storage capacitor. The first storage capacitor and the second storage capacitor share the same capacitor electrode (i.e., the control electrode Gd of the driver transistor DTFT), and another capacitor electrode (i.e., the common electrode layer 300) of the first storage capacitor CS1 and another capacitor electrode (i.e., the conductive pattern 140A) of the second storage capacitor have the same electrical potential. Therefore, the first storage capacitor and the second storage capacitor are connected in parallel to constitute a pixel storage capacitor of one of the pixel units 120. That is, the pixel storage capacitance of the pixel unit 120 is obtained by adding the first storage capacitance and the second storage capacitance. Due to the conductive pattern 140A (i.e., the capacitor electrode of the second storage capacitor), the pixel storage capacitance of the pixel unit 120 can be enhanced, and thus the OLED display 1000A may achieve favorable display effects. To be specific, the distance from the conductive pattern 140A to the control electrode Gd is less than the distance from the common electrode layer 300A to the control electrode Gd; therefore, the second storage capacitance generated by the conductive pattern 140A may be greater than the first storage capacitance generated by the common electrode layer 300A, and thus the pixel storage capacitance is significantly increased. As a result, the conventional issue of insufficient pixel storage capacitance caused by the excessively large distance from the common electrode layer to the control electrode Gd can be better resolved.

To sum up, in the OLED display and the pixel array substrate of the OLED display described in an embodiment of the invention, the net-shaped conductive pattern lessens the difference in resistances between the constant voltage source and the input electrodes of the driver transistors distributed onto the first substrate, and thereby the constant voltage respectively transmitted into the input electrode of each driver transistor does not vary significantly. Thereby, the conventional issue of unfavorable display quality caused by the significant difference in resistances between the input electrodes of the driver transistors and the constant voltage source can be better resolved.

Besides, in the OLED display provided in another embodiment of the invention, through the conductive pattern that is in electrical contact with the common electrode and is overlapped with the control electrode of each pixel unit, the pixel storage capacitance of each pixel unit may increase, and thus the OLED display is able to accomplish favorable display effects.

Although the invention has been described with reference to the above exemplary embodiments, it will be apparent to one of ordinary skill in the art that modifications to the described exemplary embodiments may be made without departing from the spirit of the invention. Accordingly, the scope of the invention will be defined by the attached claims and not by the above detailed descriptions.

What is claimed is:
1. An organic light-emitting diode display comprising:
a pixel array substrate comprising:

a first substrate having a plurality of pixel regions arranged in an array and a peripheral region surrounding the pixel regions;
a plurality of pixel units located in the pixel regions, each of the pixel units comprising:
    a switch transistor having an input electrode, a control electrode, and an output electrode;
    a driver transistor having an input electrode, a control electrode, and an output electrode, wherein the output electrode of the switch transistor is electrically coupled to the control electrode of the driver transistor; and
    a pixel electrode electrically coupled to the output electrode of the driver transistor;
a plurality of data lines located on the first substrate and electrically coupled to the input electrodes of the switch transistors;
a plurality of scan lines located on the first substrate and electrically coupled to the control electrodes of the switch transistors;
a plurality of constant voltage lines located on the first substrate and electrically coupled to the input electrodes of the driver transistors;
a constant voltage source located on the peripheral region of the first substrate, the constant voltage source providing a constant voltage to the constant voltage lines; and
a conductive pattern located on the first substrate and overlapped with the control electrode of each of the driver transistors;
a second substrate opposite to the first substrate;
an organic light-emitting diode layer located between the second substrate and the pixel electrodes; and
a common electrode layer located between the second substrate and the organic light-emitting diode layer and overlapped with the control electrodes of the driver transistors, wherein a film layer where the control electrodes of the driver transistors are located is between the first substrate and a film layer where the input electrodes of the driver transistors are located, the film layer where the input electrodes of the driver transistors are located is between a film layer where the conductive pattern is located and the film layer where the control electrodes of the driver transistors are located, the film layer where the conductive pattern is located is between the organic light-emitting diode layer and the film layer where the input electrodes of the driver transistors are located, and the conductive pattern is in electrical and physical contact with the common electrode layer.

2. The organic light-emitting diode display as recited in claim 1, wherein the common electrode layer is overlapped with the control electrode of the driver transistor of one of the pixel units to constitute a first storage capacitor, a portion of the conductive pattern is overlapped with the control electrode of the driver transistor of the one of the pixel units to constitute a second storage capacitor, and the first storage capacitor and the second storage capacitor are connected in parallel to constitute a pixel storage capacitor of the one of the pixel units.

3. The organic light-emitting diode display as recited in claim 1, wherein the conductive pattern comprises:
    a plurality of conductive lines interlaced with each other to form a net and located above the pixel regions of the first substrate; and
    a conductive frame located above the peripheral region of the first substrate, the conductive frame surrounding and being electrically coupled to the conductive lines.

4. The organic light-emitting diode display as recited in claim 3, wherein the conductive lines of the conductive pattern and the constant voltage lines are overlapped.

5. The organic light-emitting diode display as recited in claim 4, wherein the conductive lines are divided into a plurality of first conductive lines and a plurality of second conductive lines, the first conductive lines are parallel to extension directions of the constant voltage lines, the second conductive lines are interlaced with the first conductive lines, and the constant voltage lines cover the first conductive lines.

6. The organic light-emitting diode display as recited in claim 5, wherein the second conductive lines are overlapped with the control electrodes of the driver transistors and the data lines.

7. The organic light-emitting diode display as recited in claim 1, wherein the pixel array substrate further comprises a plurality of light-shielding patterns respectively shielding a plurality of channels of the switch transistors and a plurality of channels of the driver transistors.

8. The organic light-emitting diode display as recited in claim 7, wherein the light-shielding patterns and the conductive pattern are located in the same film layer.

* * * * *